(12) United States Patent
Yamamoto et al.

(10) Patent No.: US 7,605,648 B2
(45) Date of Patent: Oct. 20, 2009

(54) POWER AMPLIFIER

(75) Inventors: Kazuya Yamamoto, Tokyo (JP); Satoshi Suzuki, Tokyo (JP); Tomoyuki Asada, Tokyo (JP); Takayuki Matsuzuka, Tokyo (JP); Teruyuki Shimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 11/947,831

(22) Filed: Nov. 30, 2007

(65) Prior Publication Data

US 2009/0027130 A1  Jan. 29, 2009

(30) Foreign Application Priority Data

Jul. 23, 2007  (JP) ............................. 2007-191173

(51) Int. Cl.
*H03F 1/14* (2006.01)
(52) U.S. Cl. ...................... 330/51; 330/124 R; 330/310
(58) Field of Classification Search .................. 330/51, 330/124 R, 310
See application file for complete search history.

(56) References Cited

U.S. PATENT DOCUMENTS

| | | | |
|---|---|---|---|
| 6,204,731 B1 * | 3/2001 | Jiang et al. ................ 330/310 |
| 6,225,866 B1 * | 5/2001 | Kubota et al. .............. 330/295 |
| 6,448,859 B2 | 9/2002 | Morizuka |
| 6,741,483 B1 * | 5/2004 | Stanley ........................ 363/65 |
| 6,946,913 B2 | 9/2005 | Moriwaki et al. |
| 7,098,740 B2 | 8/2006 | Kondo et al. |
| 7,227,418 B2 | 6/2007 | Makioka |
| 7,345,537 B2 * | 3/2008 | Apel et al. .................. 330/134 |
| 7,400,202 B2 * | 7/2008 | Yamamoto et al. ......... 330/296 |
| 7,417,508 B1 * | 8/2008 | Quaglietta .................. 330/302 |
| 2006/0138460 A1 | 6/2006 | Sasaki et al. |
| 2007/0012949 A1 | 1/2007 | Kawashima et al. |
| 2007/0115062 A1 | 5/2007 | Yamamoto et al. |

FOREIGN PATENT DOCUMENTS

JP  2001-237319  8/2001

(Continued)

OTHER PUBLICATIONS

Sahu, B., et al., "A High-Efficiency Linear RF Power Amplifier With a Power-Tracking Dynamically Adaptive Buck-Boost Supply", IEEE Tans. MTT 52(1):112-120 (2004).

*Primary Examiner*—Patricia Nguyen
(74) *Attorney, Agent, or Firm*—Leydig, Voit & Mayer, Ltd.

(57) ABSTRACT

A power amplifier according to the present invention is operated by switching a main power amplifier and a subsidiary power amplifier. The idle current of the subsidiary power amplifier is smaller than the idle current of the main power amplifier. Each of the main power amplifier and the subsidiary power amplifier has a former amplification element for amplifying RF signals, a latter amplification element for amplifying output signals from the former amplification element, a former bias circuit for driving the former amplification elements, and a latter bias circuit for driving the latter amplification elements, respectively. The interval between the latter amplification element of the main power amplifier and the latter amplification element of the subsidiary power amplifier is not more than 100 μm. The interval between the latter amplification element of the main power amplifier and the latter bias circuit of the subsidiary power amplifier is not less than 200 μm.

8 Claims, 21 Drawing Sheets

FOREIGN PATENT DOCUMENTS

| | | |
|---|---|---|
| JP | 2001-274636 | 10/2001 |
| JP | 2004-194063 | 7/2004 |
| JP | 2004-343244 | 12/2004 |
| JP | 2005-295057 | 10/2005 |
| JP | 2006-186159 | 7/2006 |
| JP | 2007-036138 | 2/2007 |
| JP | 2007-134768 | 5/2007 |

* cited by examiner

| M | M | M | M | M | M | M |
|---|---|---|---|---|---|---|
| M | S | S | S | S | S | M |
| M | S | M | M | M | S | M |
| M | S | M | M | M | S | M |
| M | S | S | S | S | S | M |
| M | M | M | M | M | M | M |

POWER AMPLIFIER

BACKGROUND OF THE INVENTION

1. Field of the Invention

The present invention relates to a power amplifier enabling the improvement of delay in the rise of output power when switching a main power amplifier and a supplementary power amplifier.

2. Background Art

Currently, a GaAs-HBT (hetero-junction bipolar transistor) power amplifier is widely used as a power amplifier for mobile telephones, such as CDMA. FIG. 22 is a circuit diagram showing a conventional GaAs-HBT power amplifier. The area within the dotted-line frame is a GaAs chip, and other circuit elements are composed of chip parts and wirings formed on a module substrate.

In FIG. 22, $Tr_1$ and $Tr_2$ denote a former amplification element and a latter amplification element, respectively. Bias 1 denotes a former bias circuit to drive the former amplification element, and Bias 2 denotes a latter bias circuit to drive the latter amplification element.

$V_{c1}$ and $V_{c2}$ denote collector power terminals for former and latter amplification elements, respectively. $V_{cb}$ denotes a power terminal for the bias circuits Bias 1 and Bias 2, and $V_{ref}$ denotes a terminal to apply control voltage to the bias circuits Bias 1 and Bias 2. IN denotes an RF signal input terminal, OUT denotes an RF signal output terminal, $R_1$ to $R_4$ denote resistors, $C_1$ to $C_{10}$ denote capacitors, and $L_1$ and $L_2$ denote inductors. L3 to L8 denote wirings having predetermined electrical lengths which operate as inductors. In recent years, $C_1$, $C_2$ and $L_1$ for input matching and $C_3$, $C_4$ and $L_2$ for inter-stage matching are also often integrated on a GaAs chip for the size reduction of a module.

FIG. 23 is a circuit diagram showing a conventional bias circuit. This bias circuit is one of the above-described former bias circuit Bias 1 or latter bias circuit Bias 2. In FIG. 23, $V_{ref}$ denotes a terminal to which a control voltage is applied from outside, $Tr_{b1}$ to $Tr_{b3}$, $Tr_{b7}$ and $Tr_{b8}$ denote GaAs-HBTs, Tr denotes an amplification element, and Rb1 to Rb3 and Rb5 to Rb8 denote resistors.

Am emitter follower circuit including $Tr_{b1}$ inputs a voltage corresponding to the control voltage to the base (input terminal) of the corresponding amplification element Tr. The RF signals inputted from the terminal RFin is inputted to the base of the amplification element Tr via a capacitor C in the input matching circuit. Then, amplified RF signals are outputted from the collector of the amplification element Tr to the terminal RFout.

This bias circuit operates so as to maintain the idle current of the former amplification element and the latter amplification element of the power amplifier against temperature change (e.g., refer to Japanese Patent Laid-Open No. 2004-343244). Here, the idle current means a bias current of a power amplifier when there is no RF input power.

FIG. 24 is a graph showing the input-output characteristics of a conventional HBT power amplifier for CDMA. When the input power Pin increases, although the idle current Ictq is constant, the output power Pout increases, and the total operating current Ict increases.

FIG. 25 is a graph showing the distortion characteristics of a conventional HBT power amplifier for CDMA. The distortion characteristics are represented by an adjacent channel leakage power (ACLR). With the increase of the output power Pout, ACLR increases. The output power Pout, the power gain Gp, and the efficiency PAE determine the characteristics of the power amplifier.

FIG. 26 is a graph showing the distribution of probabilities for the output power of a power amplifier in a CDMA terminal machine in a suburban area. The probability of low output in the vicinity of 0 dBm is highest, and the probability of maximum output in the vicinity of 27 dBm is low (e.g., refer to B. Sahu and G. A. Rincon-Mora, "A high-efficiency linear RF power amplifier with a power-tracking dynamically adaptive buck-boost supply," IEEE Trans. MTT Vol. 52, No. 1, pp. 112-120, January 2004). Therefore, it is desired that the idle current is suppressed to be low when the output power is low, and the idle current is increased when the output power is high, to satisfy the distortion characteristics.

Therefore, a power amplifier operated by switching a main power amplifier having large idle current and a subsidiary power amplifier having small idle current has been proposed. FIG. 27 is a graph showing the output and gain characteristics of the main power amplifier and the subsidiary power amplifier. The main power amplifier has high efficiency and low distortion characteristics when output power is high as shown by (H) in FIG. 27. On the other hand, the subsidiary power amplifier has high efficiency and low distortion characteristics when output power is low as shown by (L) in FIG. 27. The main power amplifier and the subsidiary power amplifier are switched when the output power Pout is around Pout 2.

FIG. 28 is a diagram showing a chip layout of a conventional power amplifier operated by switching a main power amplifier and a subsidiary power amplifier. A GaAa chip 32 is mounted on a module substrate 31 via a die-bonding material. On the GaAa chip 32, a main power amplifier (an input matching circuit 11, a former amplification element 12, an inter-stage matching circuit 13, a latter amplification element 14, output matching circuits 15, a former bias circuit 16, and a latter bias circuit 17) and a subsidiary power amplifier (an input matching circuit 21, a former amplification element 22, an inter-stage matching circuit 23, a latter amplification element 24, output matching circuits 25, a former bias circuit 26, and a latter bias circuit 27) are formed. The former amplification element 12, the former amplification element 22, the latter amplification element 14, and the latter amplification element 24 are hetero-junction bipolar transistors (HBT).

FIG. 29 is a graph showing output power characteristics of a conventional power amplifier operated by switching a main power amplifier and a subsidiary power amplifier. The response of output power when switching the main power amplifier and the subsidiary power amplifier is slow, and a long time is consumed until the stabilization of the power level. Specifically, several hundreds of microseconds to several milliseconds were required for the stabilization of the power level, while several tens of microseconds were demanded for this. Therefore, serious problems have been caused when a conventional power amplifier is used as a power amplifier for CDMA wherein time-to-time power-level adjustment is required.

Findings obtained by the present inventors from simulations and experiments carried out for investigating the causes of the problems are as follows:

FIG. 30 is a graph showing the step response of the collector current of an HBT in base voltage driving: and FIG. 31 is a graph showing the step response of the collector current of an HBT in base current driving. The HBT itself generates heat represented by the product of the collector current Ic and the collector-emitter voltage Vce. Due to this self-heating, the transient response of the collector current Ic in base voltage driving is extremely slow (several hundreds of microseconds to several milliseconds). On the other hand, the response of the collector current Ic in base current driving is very quick (several microseconds or less). Therefore, when an emitter follower circuit that operates in a state nearly base voltage driving as shown in FIG. 23, the transient response of the collector current Ic of the HBT is slow.

Furthermore, the mutual heat interference between circuit blocks in a chip may further retard the transient response of the collector current of an HBT. This will be described below.

FIG. 32 is a graph showing the output voltage characteristics of the latter bias circuit of a subsidiary power amplifier against the heat generation of the latter bias circuit of a main power amplifier. The configuration of the latter bias circuit is as shown in FIG. 23. The interval between the latter bias circuit of the main power amplifier and the latter bias circuit of the subsidiary power amplifier is about 700 μm in Type 1, and about 200 μm in Type 2. From these data, it is known that the larger the heat Pd generated in the latter bias circuit of the main power amplifier, the lower the output voltage Vbo of the latter bias circuit of the subsidiary power amplifier.

Here, heat generated in the latter bias circuit of the main power amplifier during the operation of the main power amplifier is dissipated during the operation of the subsidiary power amplifier. However, due to the effect of the heat capacity of the module substrate and chips, a long time is consumed for heat dissipation. Therefore, the idle current of the latter bias circuit of the subsidiary power amplifier is gradually increased, and as shown in FIG. 32, the output voltage Vbo of the latter bias circuit of the subsidiary power amplifier is gradually increased. Therefore, when the main power amplifier is switched to the subsidiary power amplifier, the rise of the output power of the subsidiary power amplifier is delayed as shown in FIG. 29. Similarly, when the subsidiary power amplifier is switched to the main power amplifier, the rise of the output power of the main power amplifier is also delayed.

SUMMARY OF THE INVENTION

The present invention is made to solve the above-described problems, and an object of the present invention is to provide a power amplifier that can improve the delay of rise in output power when switching the main power amplifier and the subsidiary power amplifier.

According to one aspect of the present invention, a power amplifier is operated by switching a main power amplifier and a subsidiary power amplifier whose idle current is smaller than the idle current of the main power amplifier. each of the main power amplifier and the subsidiary power amplifier comprises a former amplification element for amplifying RF signals. a latter amplification element for amplifying output signals from the former amplification element, a former bias circuit for driving the former amplification element, and a latter bias circuit for driving the latter amplification element. The interval between the latter amplification element of the main power amplifier and the latter amplification element of the subsidiary power amplifier is not more than 100 μm. The interval between the latter amplification element of the main power amplifier and the latter bias circuit of the subsidiary power amplifier is not less than 200 μm.

According to the present invention, the delay of rise in output power when switching the main power amplifier and the subsidiary power amplifier can be improved.

Other and further objects, features and advantages of the invention will appear more fully from the following description.

BRIEF DESCRIPTION OF THE DRAWINGS

FIG. 11 is a graph showing output power characteristics of the former amplification element of the main power amplifier.

DETAILED DESCRIPTION OF THE PREFERRED EMBODIMENTS

First Embodiment

Figure 1:
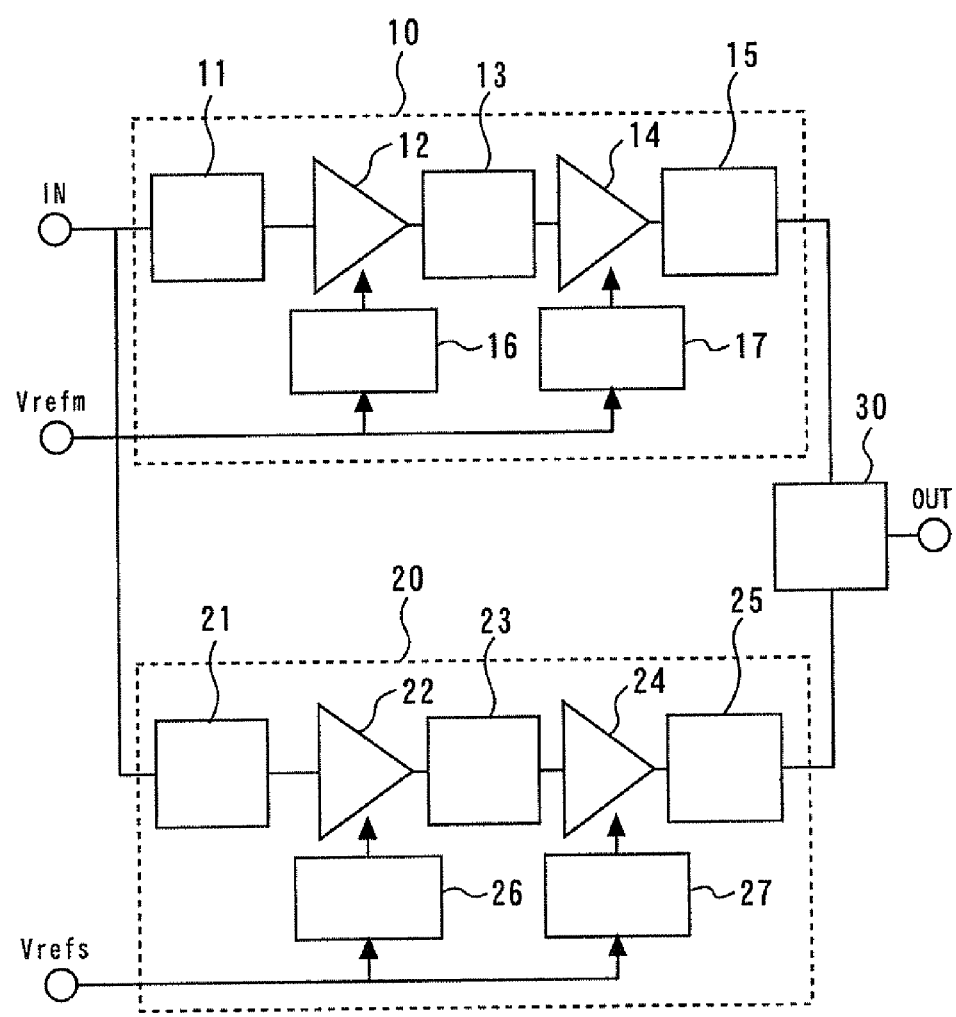
FIG. 1 is a block diagram illustrating a power amplifier according to the first embodiment of the present invention.

FIG. 1 is a block diagram illustrating a power amplifier according to the first embodiment of the present invention. This power amplifier is a power amplifier operated by switching a main power amplifier 10 and a subsidiary power amplifier 20 having a smaller idle current than the main power amplifier 10. RF signals inputted from a terminal IN are amplified by one of the main power amplifier 10 and the subsidiary power amplifier 20. The output powers of the main power amplifier 10 and the subsidiary power amplifier 20 are synthesized by a power synthesizing circuit 30 and outputted form a terminal OUT. Alternatively, the paths of the main power amplifier 10 and the subsidiary power amplifier 20 may be switched using a switch or the like instead of the power synthesizing circuit 30.

In the main power amplifier 10, an input matching circuit 11, a former amplification element 12, an inter-stage matching circuit 13, a latter amplification element 14, and an output matching circuit 15 are connected in series. The former amplification element 12 amplifies the RF signals, and the latter amplification element 14 amplifies the output signals of the former amplification element 12. A former bias circuit 16 drives the former amplification element 12 corresponding to the control voltage inputted from a terminal Vrefm. A latter bias circuit 17 drives the latter amplification element 14 corresponding to the control voltage inputted from a terminal Vrefm.

On the other hand, in the subsidiary power amplifier 20, an input matching circuit 21, a former amplification element 22, an inter-stage matching circuit 23, a latter amplification element 24, and an output matching circuit 25 are connected in series. The former amplification element 22 amplifies the RF signals, and the latter amplification element 24 amplifies the output signals of the former amplification element 22. A former bias circuit 26 drives the former amplification element 22 corresponding to the control voltage inputted from a terminal Vrefs. A latter bias circuit 27 drives the latter amplification element 24 corresponding to the control voltage inputted from a terminal Vrefs.

Since the subsidiary power amplifier 20 has a smaller idle current than the main power amplifier 10, the main power amplifier 10 operates at a high efficiency when the output power is high, and the subsidiary power amplifier 20 operates at a high efficiency when the output power is low. When a "High" control voltage is inputted from the terminal Vrefm, the main power amplifier 10 is operated, and when a "High" control voltage is inputted from the terminal Vrefs, the subsidiary power amplifier 20 is operated. Although both power amplifiers may be turned off when a "Low" control voltage is inputted from the both terminals, no "High" control voltage is inputted from the both terminals. The main power amplifier 10 and the subsidiary power amplifier 20 are thus switched and operated by the control voltage from outside.

Figure 2:
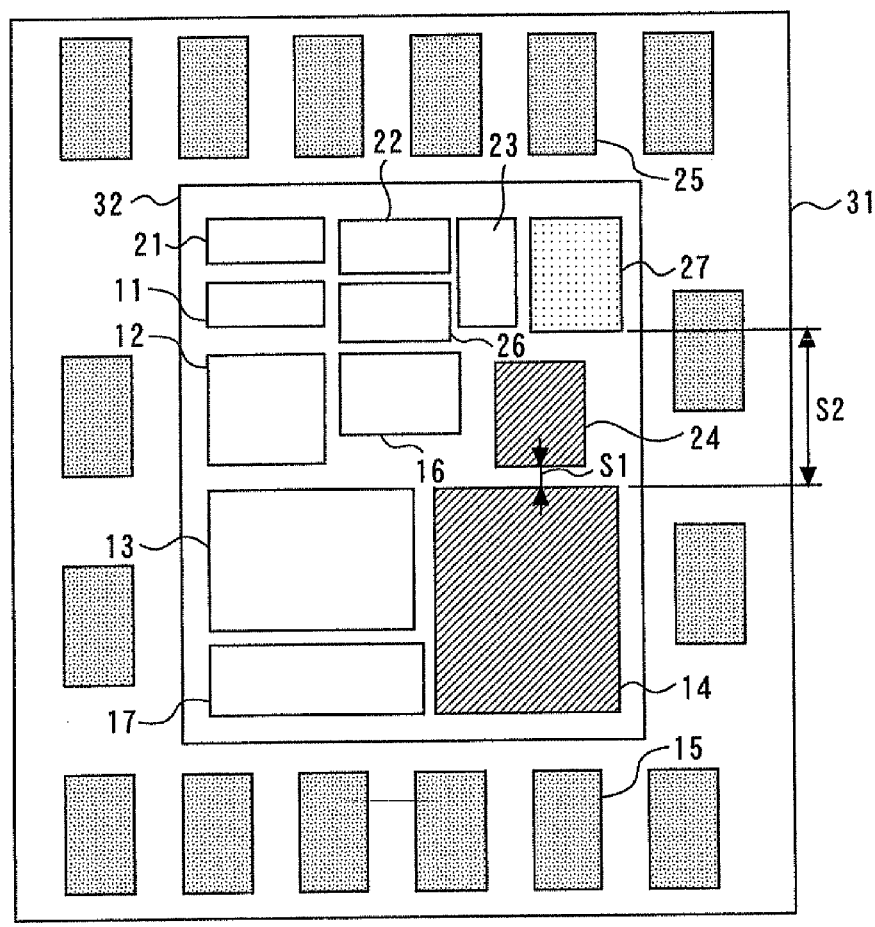
FIG. 2 is a diagram showing the chip layout of a power amplifier according to the first embodiment of the present invention.

FIG. 2 is a diagram showing the chip layout of a power amplifier according to the first embodiment of the present invention. A GaAs chip 32 is mounted on a module substrate 31 via a die-bonding material. On the GaAa chip 32, input matching circuits 11 and 21, former amplification elements 12 and 22, inter-stage matching circuits 13 and 23, latter amplification elements 14 and 24, output matching circuits 15 and 25, former bias circuits 16 and 26, and latter bias circuits 17 and 27 are formed. The former amplification elements 12 and 22, and the latter amplification elements 14 and 24 are hetero-junction bipolar transistors (HST).

In the first embodiment, the interval S1 between the latter amplification element 14 of the main power amplifier and the latter amplification element 24 of the subsidiary power amplifier is not more than 100 μm, and the interval S2 between the latter amplification element 14 of the main power amplifier and the latter bias circuit 27 of the subsidiary power amplifier is not less than 200 μm.

Figure 3:
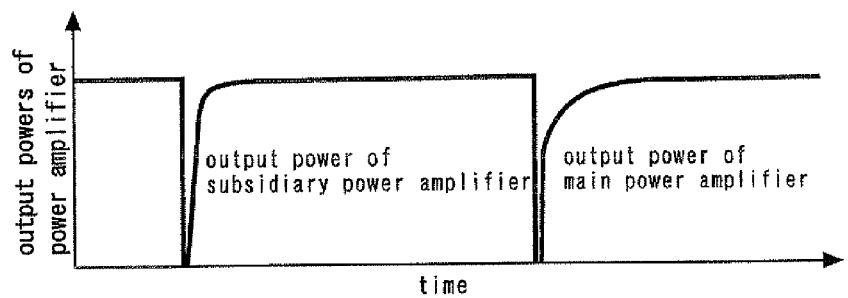
FIG. 3 is a graph showing the result of measuring the output powers of power amplifiers according to the first embodiment of the present invention.

FIG. 3 is a graph showing the result of measuring the output powers of power amplifiers according to the first embodiment of the present invention. In this measurement, the thermal resistance between a die pad section on the upper surface of the module substrate 31 and a GND electrode on the lower surface of the GaAs chip 32 was 2 to 10° C./W, the thermal resistance between the amplification element on the upper surface of the GaAs chip 32 and the GND electrode on the lower surface of the GaAs chip 32 was 20 to 50° C./W, and the thermal resistance between the upper surface of the die bonding material (the lower surface of the GaAs chip 32) and the lower surface of the die bonding material (the upper surface of the module substrate 31) was 2 to 20° C./W. It was known from the results of measurement that the rise of output power of the subsidiary power amplifier was improved to about several microseconds.

As described above, by disposing the latter amplification element 14 of the main power amplifier in the vicinity of the latter amplification element 24 of the subsidiary power amplifier, the latter amplification element 24 of the subsidiary power amplifier is preheated by the slow heat dissipation of the latter amplification element 14 of the main power amplifier when the operation is switched from the main power amplifier 10 to the subsidiary power amplifier 20, and the rise of the collector current can be improved. In addition, by disposing the latter amplification element 14 of the main power amplifier apart from the latter bias circuit 27 of the subsidiary power amplifier, the effect of heat generated in the latter amplification element 14 of the main power amplifier to the latter bias circuit 27 of the subsidiary power amplifier can be reduced. As a result, the delay of rise in the output power of the subsidiary power amplifier 20 can be improved.

Second Embodiment

Figure 4:
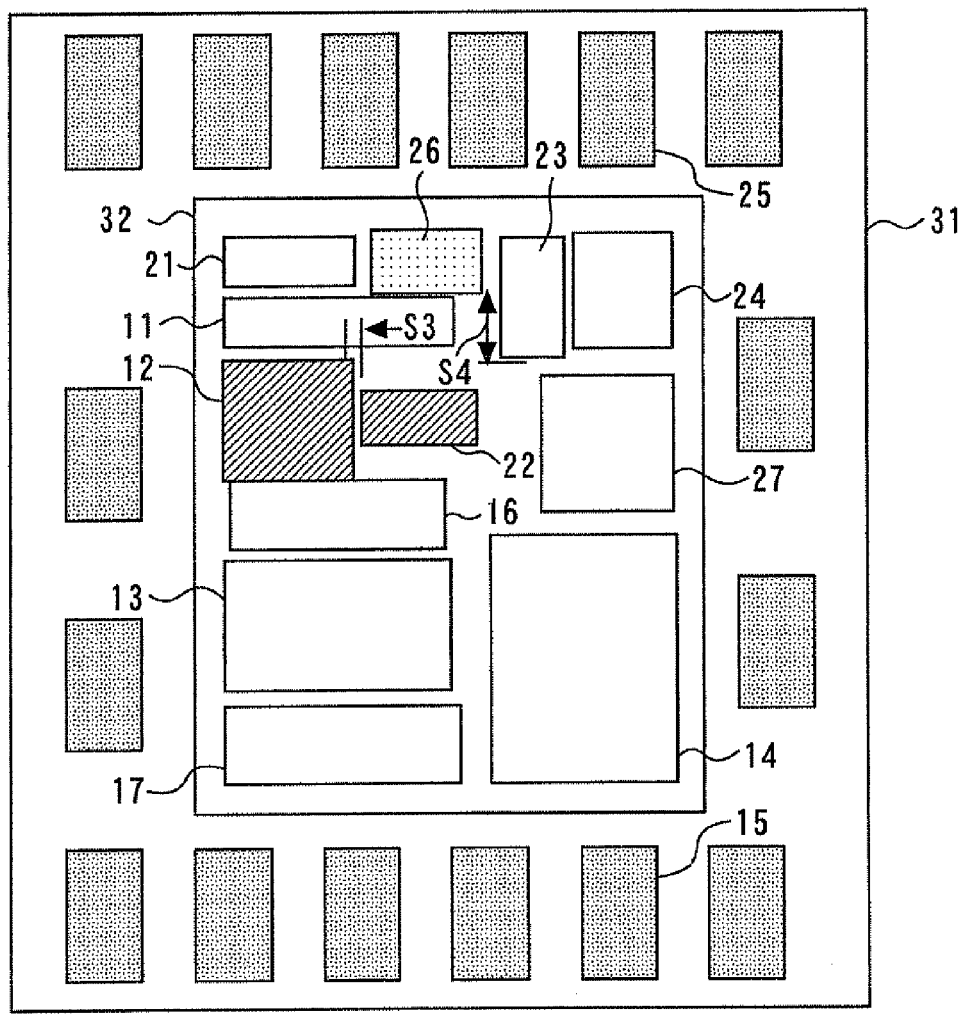
FIG. 4 is a diagram showing the chip layout of a power amplifier according to the second embodiment of the present invention.

FIG. 4 is a diagram showing the chip layout of a power amplifier according to the second embodiment of the present invention. In the second embodiment, the interval S3 between the former amplification element 12 of the main power amplifier and the former amplification element 22 of the subsidiary power amplifier is not more than 50 μm, and the interval S4 between the former amplification element 12 of the main power amplifier and the former bias circuit 26 of the subsidiary power amplifier is not less than 100 μm. Other configurations are same as in the first embodiment.

Figure 5:
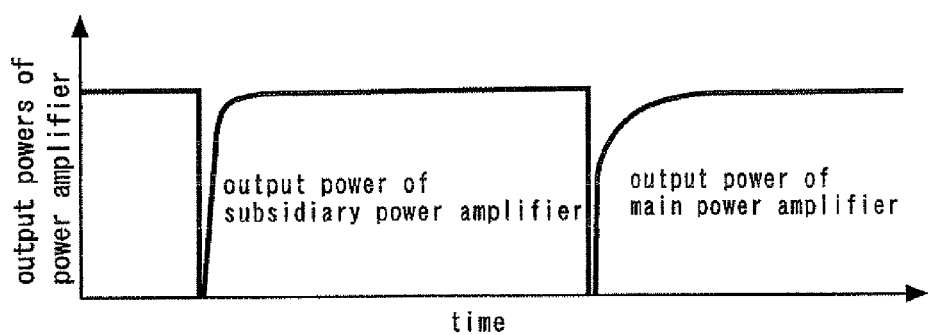
FIG. 5 is a graph showing the result of measuring the output powers of power amplifiers according to the second embodiment of the present invention.

FIG. 5 is a graph showing the result of measuring the output powers of power amplifiers according to the second embodiment of the present invention. In this measurement, the thermal resistance between a die pad section on the upper surface of the module substrate 31 and a GND electrode on the lower surface of the GaAs chip 32 was 2 to 10° C./W, the thermal resistance between the amplification element on the upper surface of the GaAs chip 32 and the GND electrode on the lower surface of the GaAs chip 32 was 20 to 50° C./W, and the thermal resistance between the upper surface of the die bonding material (the lower surface of the GaAs chip 32) and the lower surface of the die bonding material (the upper surface of the module substrate 31) was 2 to 20° C./W. It was known from the results of measurement that the rise of output power of the subsidiary power amplifier was improved to about several microseconds.

As described above, by disposing the former amplification element 12 of the main power amplifier in the vicinity of the former amplification element 22 of the subsidiary power amplifier, and by disposing the former amplification element 12 of the main power amplifier apart from the former bias circuit 26 of the subsidiary power amplifier, the delay of rise in the output power of the subsidiary power amplifier 20 can be improved in the same manner as in the first embodiment. However, since the heat generation of the former amplification element 12 is smaller than the heat generation of the latter amplification element 14, the effect of improving the delay of rise in the output power is smaller than the effect by the first embodiment.

Third Embodiment

Figure 6:
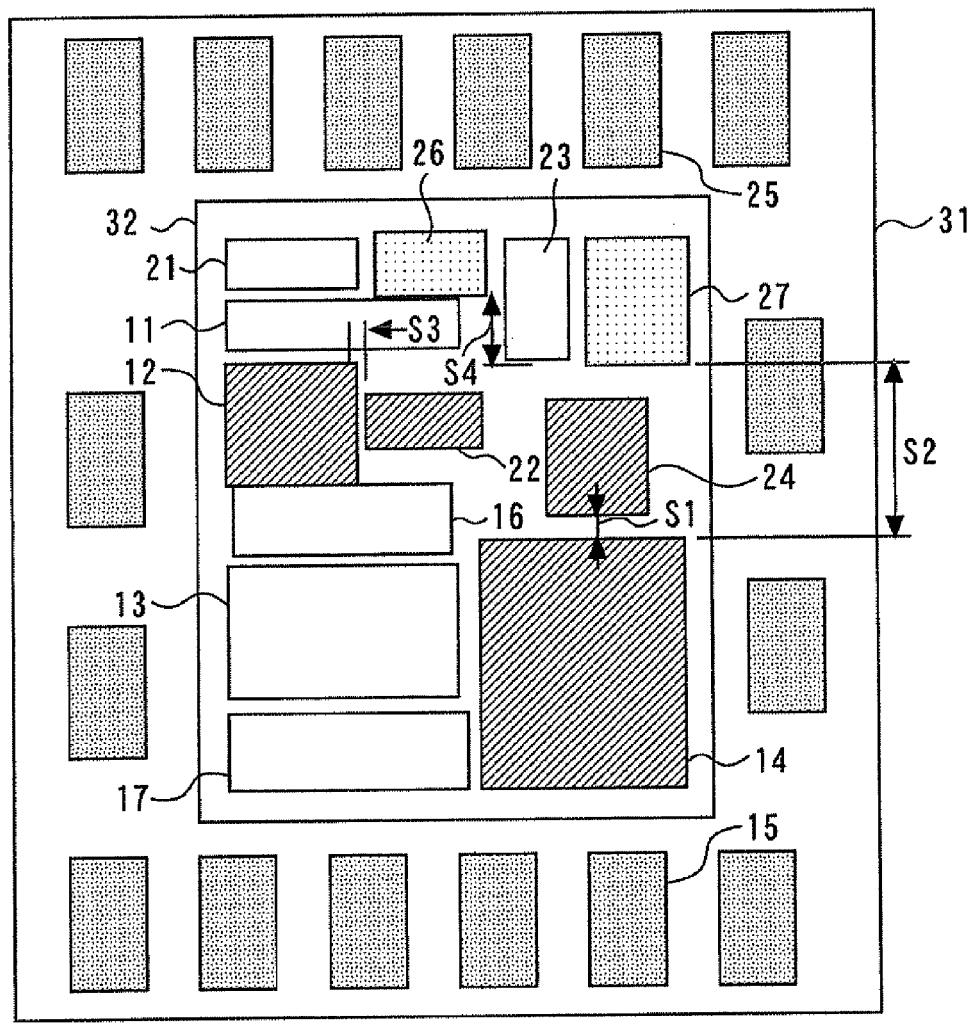
FIG. 6 is a diagram showing the chip layout of a power amplifier according to the third embodiment of the present invention.

FIG. 6 is a diagram showing the chip layout of a power amplifier according to the third embodiment of the present invention. The third embodiment is a combination of the first embodiment and the second embodiment. Specifically, the interval S1 between the latter amplification element 14 of the main power amplifier and the latter amplification element 24 of the subsidiary amplifier is not more than 100 μm, and the interval S2 between the latter amplification element 14 of the main power amplifier and the latter bias circuit 27 of the subsidiary power amplifier is not less than 200 μm; and the interval S3 between the former amplification element 12 of the main power amplifier and the former amplification element 22 of the subsidiary power amplifier is not more than 50 μm, and the interval S4 between the former amplification element 12 of the main power amplifier and the former bias circuit 26 of the subsidiary power amplifier is not less than 100 μm.

Figure 7:
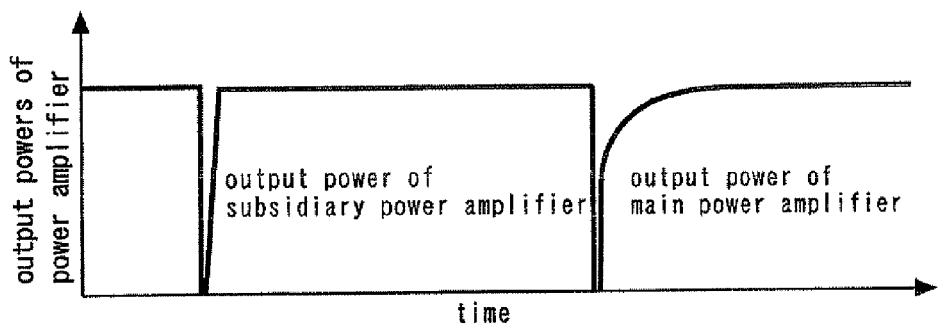
FIG. 7 is a graph showing the result of measuring the output powers of power amplifiers according to the third embodiment of the present invention.

FIG. 7 is a graph showing the result of measuring the output powers of power amplifiers according to the third embodiment of the present invention. In this measurement, the thermal resistance between a die pad section on the upper surface of the module substrate 31 and a GND electrode on the lower surface of the GaAs chip 32 was 2 to 10° C./W, the thermal resistance between the amplification element on the upper surface of the GaAs chip 32 and the GND electrode on the lower surface of the GaAs chip 32 was 20 to 50° C./W, and the thermal resistance between the upper surface of the die bonding material (the lower surface of the GaAs chip 32) and the lower surface of the die bonding material (the upper surface of the module substrate 31) was 2 to 20° C./W. It was known from the results of measurement that the rise of output power of the subsidiary power amplifier was improved to about several microseconds.

As described above, by disposing the latter amplification element 14 of the main power amplifier in the vicinity of the latter amplification element 24 of the subsidiary power amplifier, by disposing the former amplification element 12 of the main power amplifier in the vicinity of the former amplification element 22 of the subsidiary power amplifier, by disposing the latter amplification element 14 of the main power amplifier apart from the latter bias circuit 27 of the subsidiary power amplifier, and by disposing the former amplification element 12 of the main power amplifier apart from the former bias circuit 26 of the subsidiary power amplifier, the delay of rise in the output power 20 can be more improved than the first and second embodiments.

Fourth Embodiment

Figure 8:
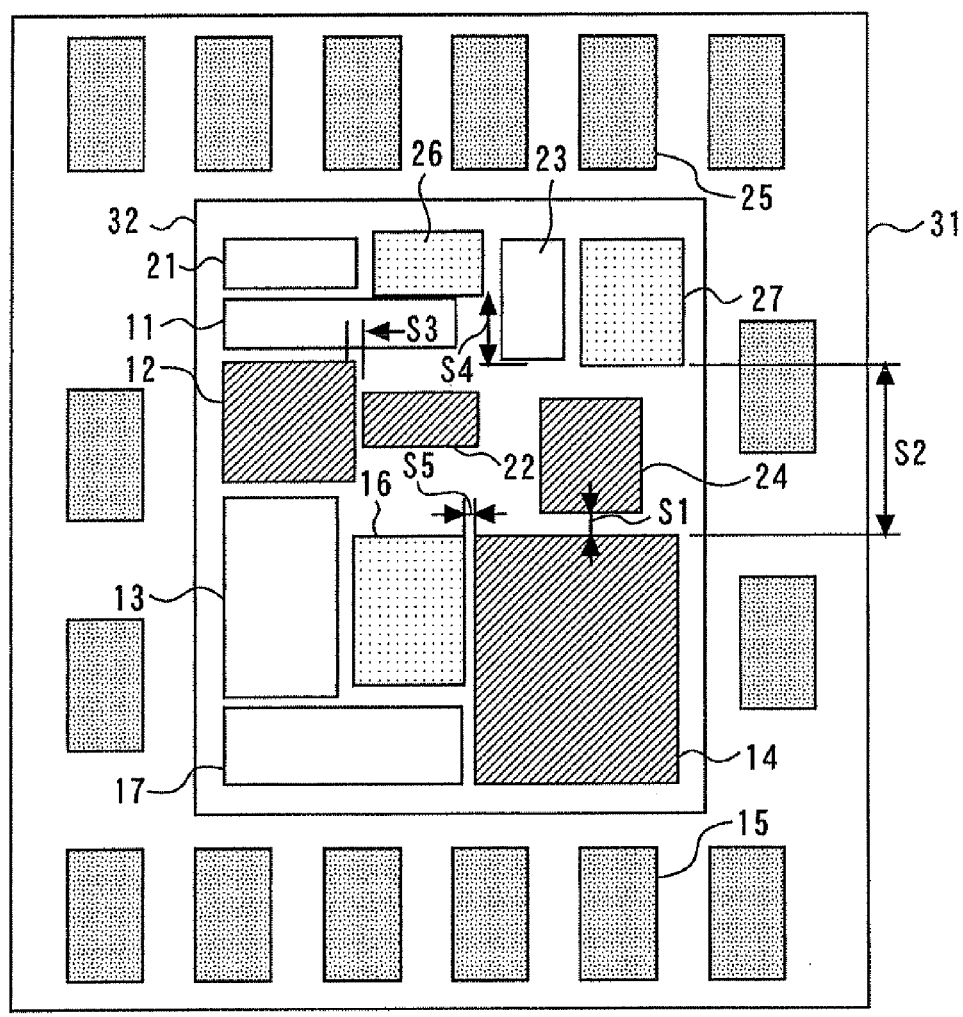
FIG. 8 is a diagram showing the chip layout of a power amplifier according to the fourth embodiment of the present invention.

FIG. 8 is a diagram showing the chip layout of a power amplifier according to the fourth embodiment of the present invention. In the fourth embodiment, in addition to the configuration of the third embodiment, the interval S5 between the latter amplification element 14 of the main power amplifier and the former bias circuit 16 of the main power amplifier is not more than 100 μm.

Figure 9:
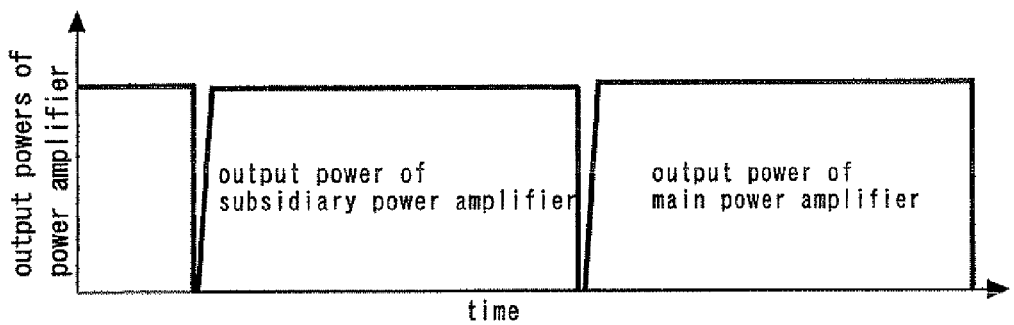
FIG. 9 is a graph showing the result of measuring the output powers of power amplifiers according to the fourth embodiment of the present invention.

FIG. 9 is a graph showing the result of measuring the output powers of power amplifiers according to the fourth embodiment of the present invention. In this measurement, the thermal resistance between a die pad section on the upper surface of the module substrate 31 and a GND electrode on the lower surface of the GaAs chip 32 was 2 to 10° C./W, the thermal resistance between the amplification element on the upper surface of the GaAs chip 32 and the GND electrode on the lower surface of the GaAs chip 32 was 20 to 50° C./W, and the thermal resistance between the upper surface of the die bonding material (the lower surface of the GaAs chip 32) and the lower surface of the die bonding material (the upper surface of the module substrate 31) was 2 to 20° C./W. It was known from the results of measurement that not only the rise of output power of the subsidiary power amplifier but also that of the main power amplifier were improved to about several microseconds.

Figure 10:
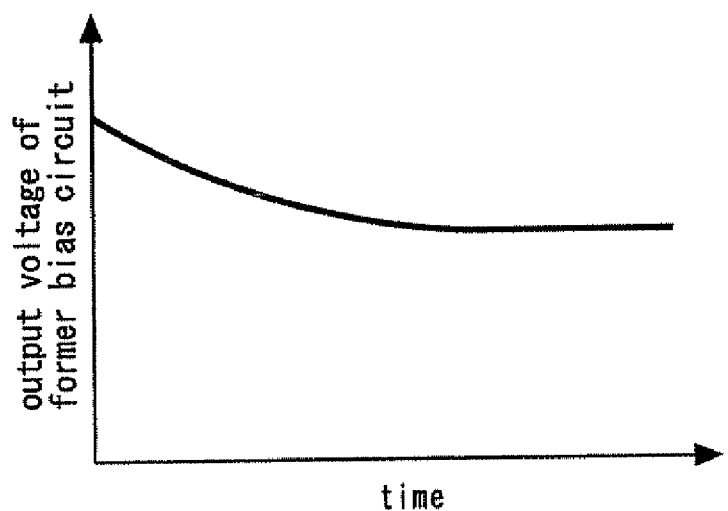
FIG. 10 is a graph showing output voltage characteristics of the former bias circuit.
Figure 11:
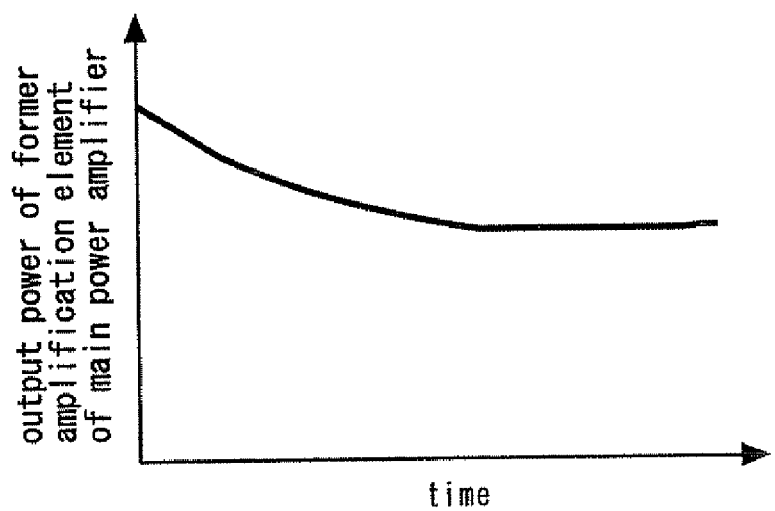
FIG. 11 is a graph showing output poster characteristics of the former amplification element of the main power amplifier.
Figure 12:
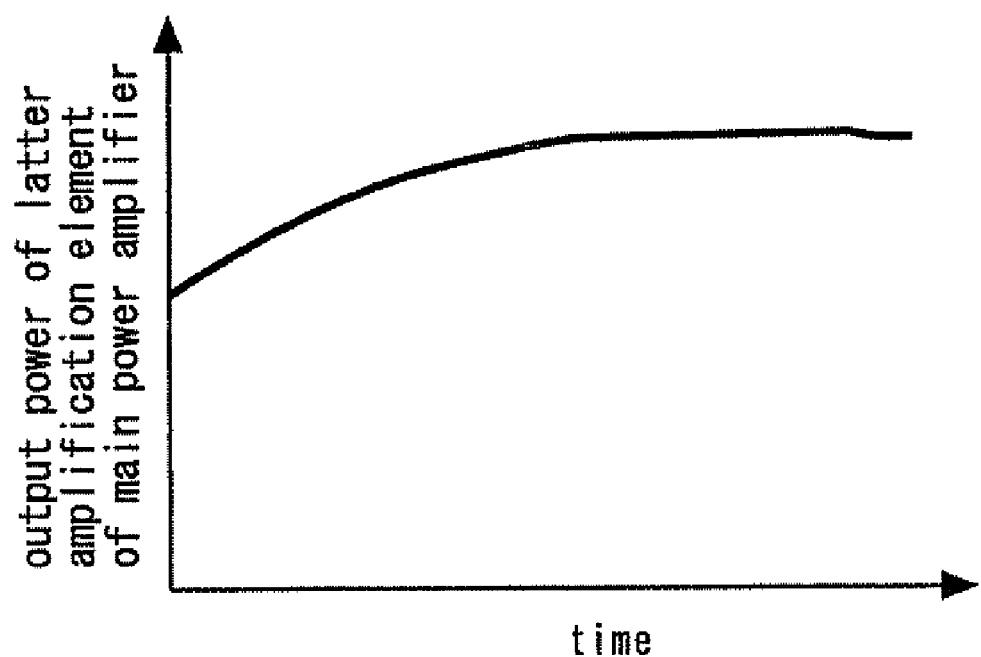
FIG. 12 is a graph showing output power characteristics of the latter amplification element of the main power amplifier.

As described above, by disposing the latter amplification element 14 of the main power amplifier in the vicinity of the former bias circuit 16 of the main power amplifier, when operations are switched from the subsidiary power amplifier to the main power amplifier, the former bias circuit of the main power amplifier is heated by heat generated in the latter amplification element of the main power amplifier. Thereby, as shown in FIG. 10, the output voltage of the former bias circuit is lowered. Correspondingly, as shown in FIG. 11, the output power of the former amplification element 12 of the main power amplifier is also lowered with the lapse of time. On the other hand, as shown in FIG. 12, the output power of the latter amplification element 14 of the main power amplifier is increased by self-heating with the lapse of time. As a result, since the delay of output power is offset, the delay in the rise of the output power of the main power amplifier can be improved.

Fifth Embodiment

Figure 13:
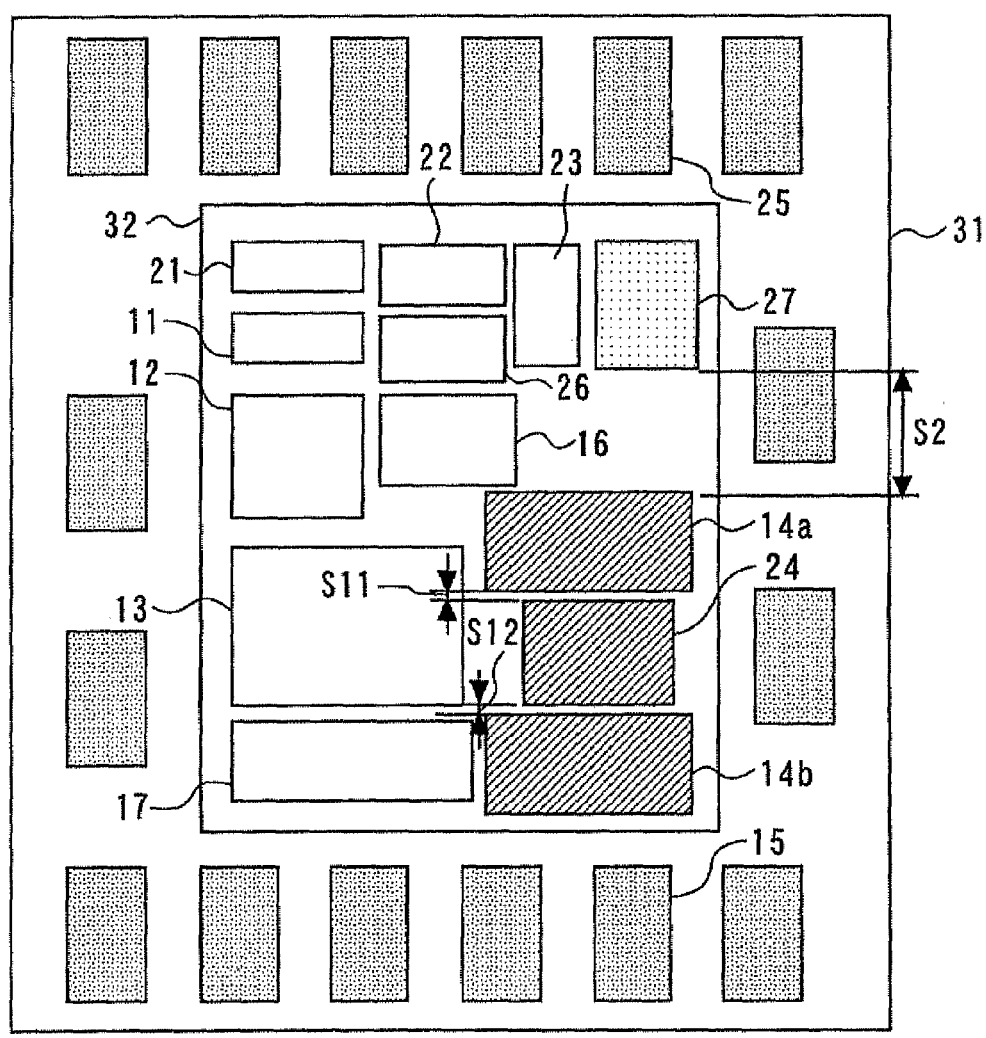
FIG. 13 is a circuit diagram of a former bias circuit in the subsidiary power amplifier of a power amplifier according to the fifth embodiment of the present invention.

FIG. 13 is a circuit diagram of a former bias circuit in the subsidiary power amplifier of a power amplifier according to the fifth embodiment of the present invention. The latter amplification element of the main power amplifier is divided into a first latter amplification element 14a and a second latter amplification element 14b. Between the first latter amplification element 14a and the second latter amplification element 14b, a latter amplification element 24 of the subsidiary power amplifier is disposed.

The intervals S11 and S12 between the latter amplification element 24 of the subsidiary power amplifier, and the first and the second latter amplification elements 14a and 14b are not more than 100 μm, respectively; and the interval S2 between the latter bias circuit 27 of the subsidiary power amplifier, and the first and the second latter amplification elements 14a and 14b are not less than 200 μm, respectively. Other configurations are same as in the first embodiment.

As described above, by disposing the latter amplification elements 14a and 14b of the main power amplifier in the vicinity of the latter amplification element 24 of the subsidiary power amplifier, the delay of the rise in the output power of the subsidiary power amplifier can be improved in the same manner as in the fires embodiment.

Figures 14, 15:
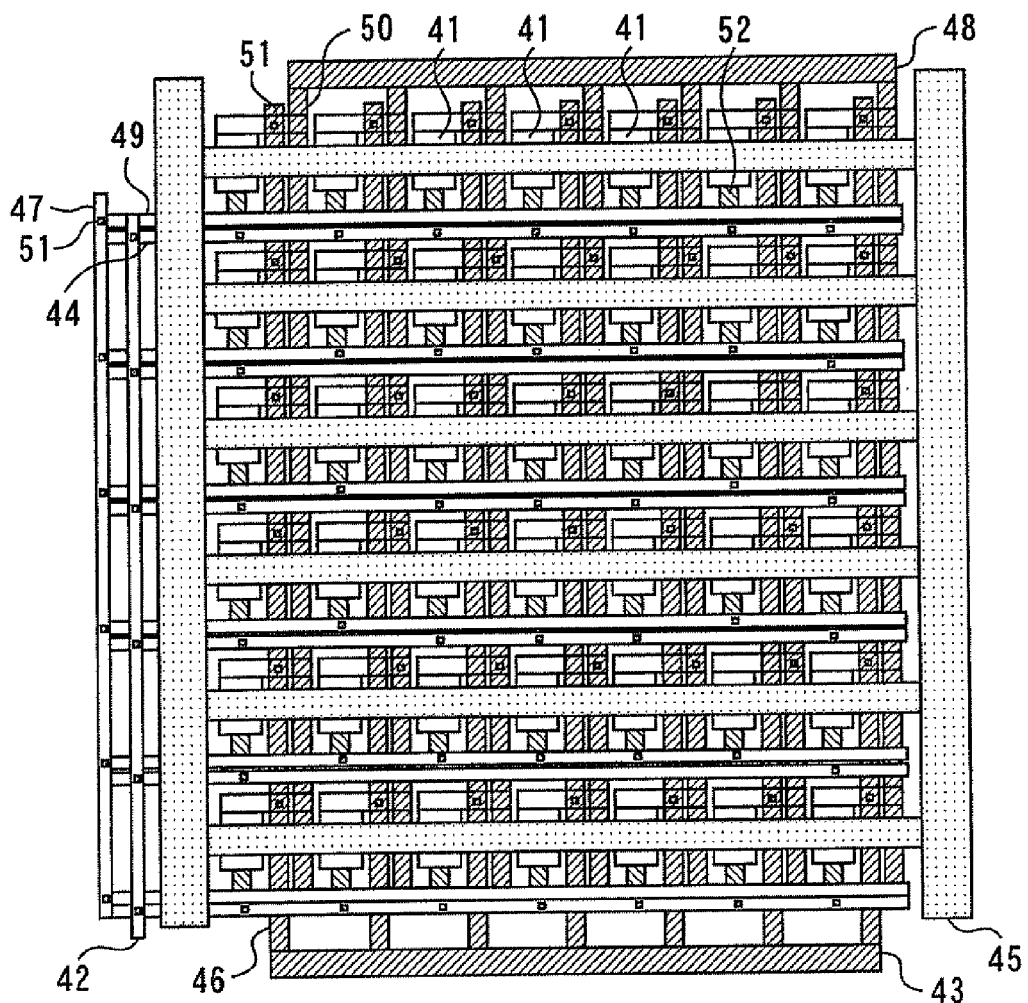
FIG. 14 is a diagram showing the chip layout of latter amplification elements of the main power amplifier and latter amplification elements of the subsidiary power amplifier according to the variation example of the fifth embodiment of the present invention.
FIG. 15 is a schematic diagram showing the layout of the transistor cells in the circuit shown in FIG. 14.

FIG. 14 is a diagram showing the chip layout of latter amplification elements of the main power amplifier and latter amplification elements of the subsidiary power amplifier according to the variation example of the fifth embodiment of the present invention. Transistor cells 41 arrayed in a 6×7 matrix are latter amplification elements of the main power amplifier or latter amplification elements of the subsidiary power amplifier. The reference numeral 42 denotes an RF input terminal of the main power amplifier, 43 denotes an RF output terminal of the main power amplifier, 44 denotes a base line of the main power amplifier, 45 denotes an emitter line (ground), and 46 denotes a collector line of the main power amplifier. The reference numeral 47 denotes an RF input terminal of the subsidiary power amplifier, 48 denotes an RF output terminal of the subsidiary power amplifier, 49 denotes a base line of the subsidiary power amplifier, and 50 denotes a collector line of the subsidiary power amplifier. The reference numeral 51 denotes a through-hole, and 52 denotes a ballast resistor.

FIG. 15 is a schematic diagram showing the layout of the transistor cells in the circuit shown in FIG. 14. The latter amplification elements M of the main power amplifier and the latter amplification elements S of the subsidiary power amplifier are jointly and closely mounted. Thereby an equivalent effect as described above can be obtained.

Sixth Embodiment

Figure 16:
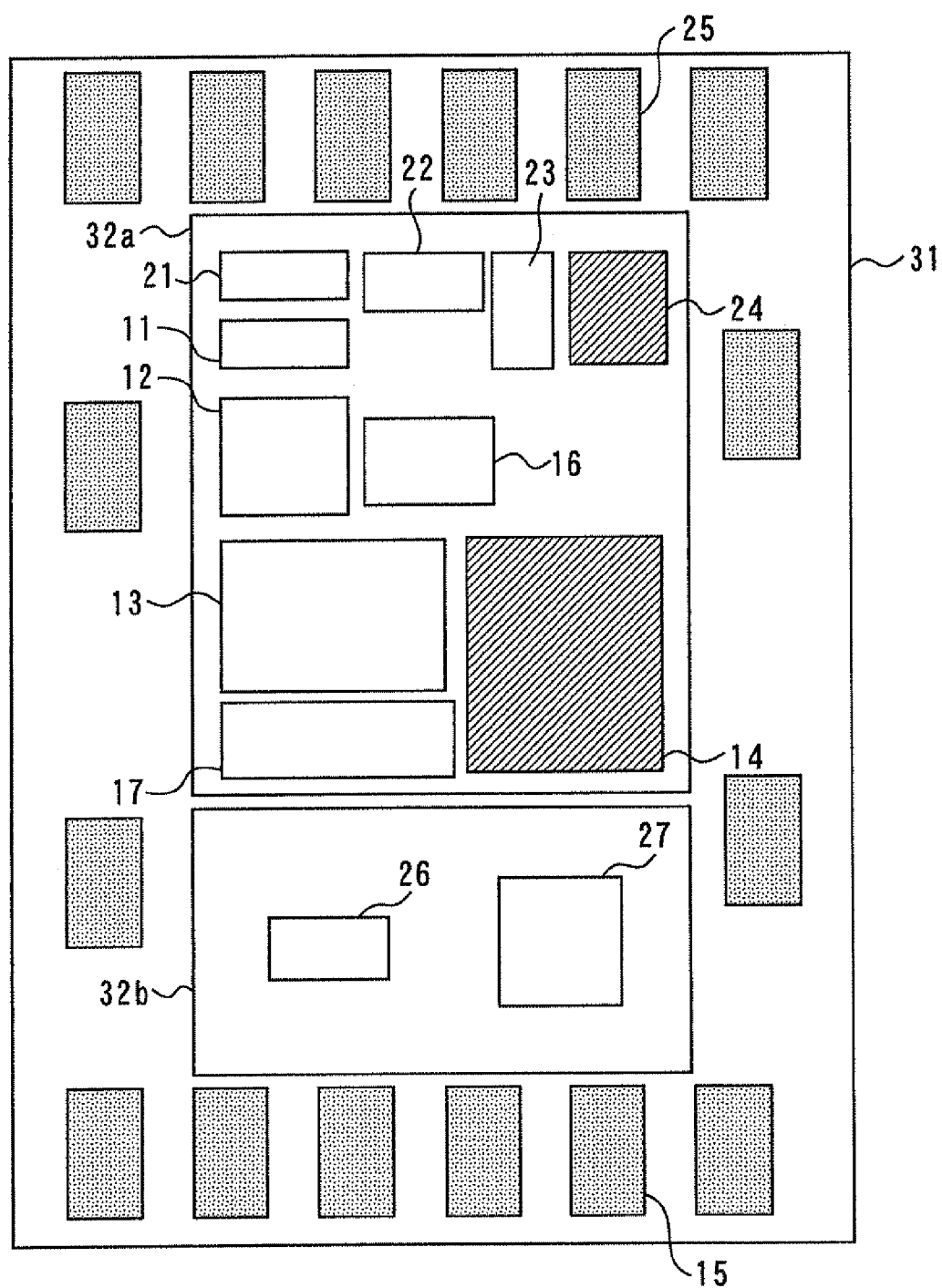
FIG. 16 is a diagram showing the chip layout of a power amplifier according to the sixth embodiment of the present invention.

FIG. 16 is a diagram showing the chip layout of a power amplifier according to the sixth embodiment of the present invention. A former amplification element 12 of the main power amplifier, a former amplification element 22 of the subsidiary power amplifier, a latter amplification element 14 of the main power amplifier, a latter amplification element 24 of the subsidiary power amplifier, a former bias circuit 16 of the main power amplifier, a latter bias circuit 17 of the main power amplifier, and the like are formed on a GaAs chip 32a (first chip).

On the other hand, a former bias circuit 26 of the subsidiary power amplifier and a latter bias circuit 27 of the subsidiary power amplifier are formed on another GaAs chip 32b (second chip). By thus collectively forming circuits wherein thermal interference affects the delay of output power of the subsidiary power amplifier on a separate chip, the delay in the rise of the output power of the subsidiary power amplifier can be improved.

Seventh Embodiment

Figure 17:
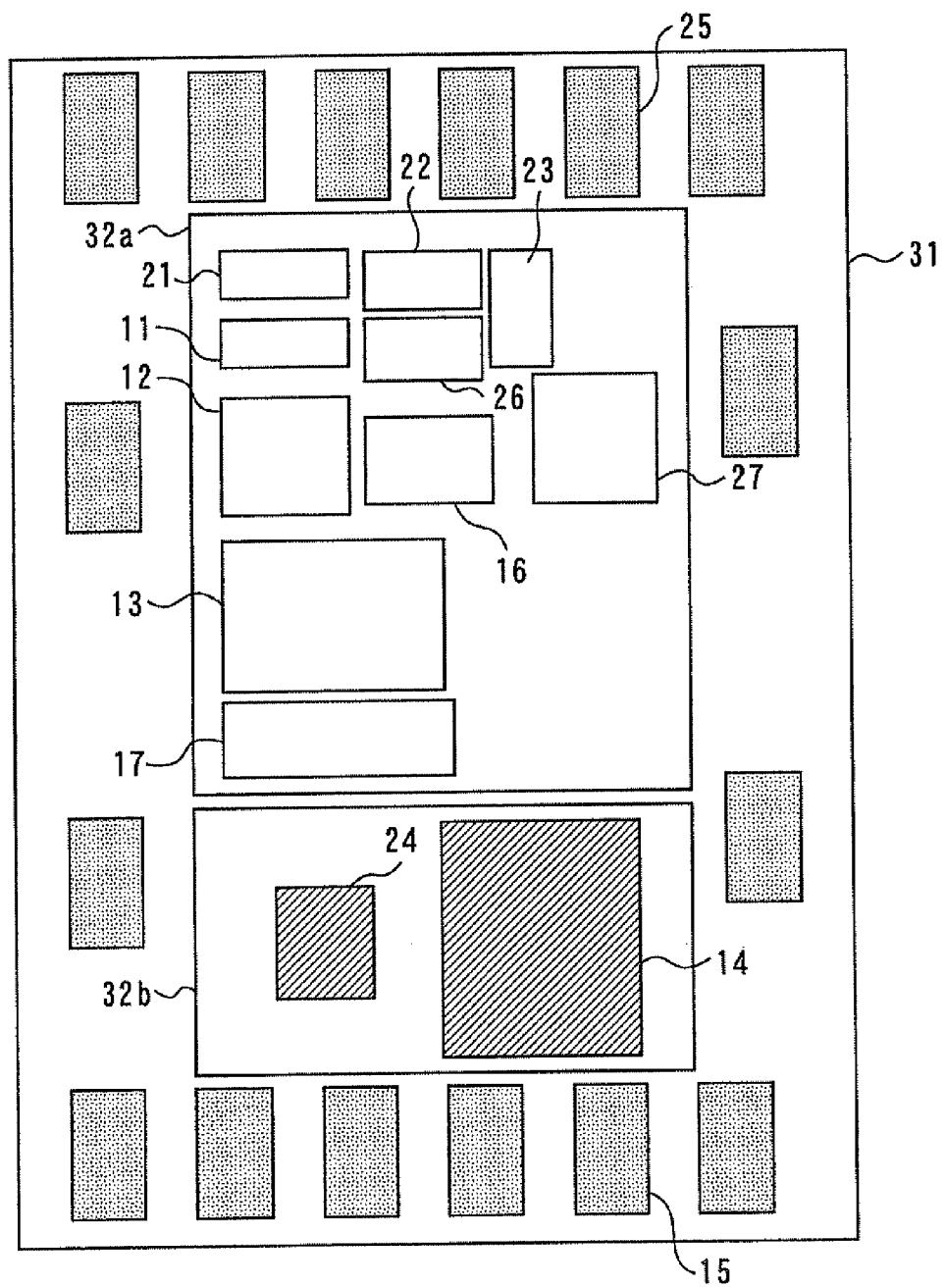
FIG. 17 is a diagram showing the chip layout of a power amplifier according to the seventh embodiment of the present invention.

FIG. 17 is a diagram showing the chip layout of a power amplifier according to the seventh embodiment of the present invention. A former amplification element 12 of the main power amplifier, a former amplification element 22 of the subsidiary power amplifier, a former bias circuit 16 of the main power amplifier, a former bias circuit 26 of the subsidiary power amplifier, a latter bias circuit 17 of the main power amplifier, a latter bias circuit 27 of the subsidiary power amplifier, and the like are formed on a GaAs chip 32a (first chip).

On the other hand, a latter amplification element 14 of the main power amplifier and a latter amplification element 24 of the subsidiary power amplifier are formed on another GaAs chip 32b (second chip). By thus forming circuits that generate large heat on a separate chip, the delay in the rise of the output power of the subsidiary power amplifier can be improved.

Eighth Embodiment

Figure 18:
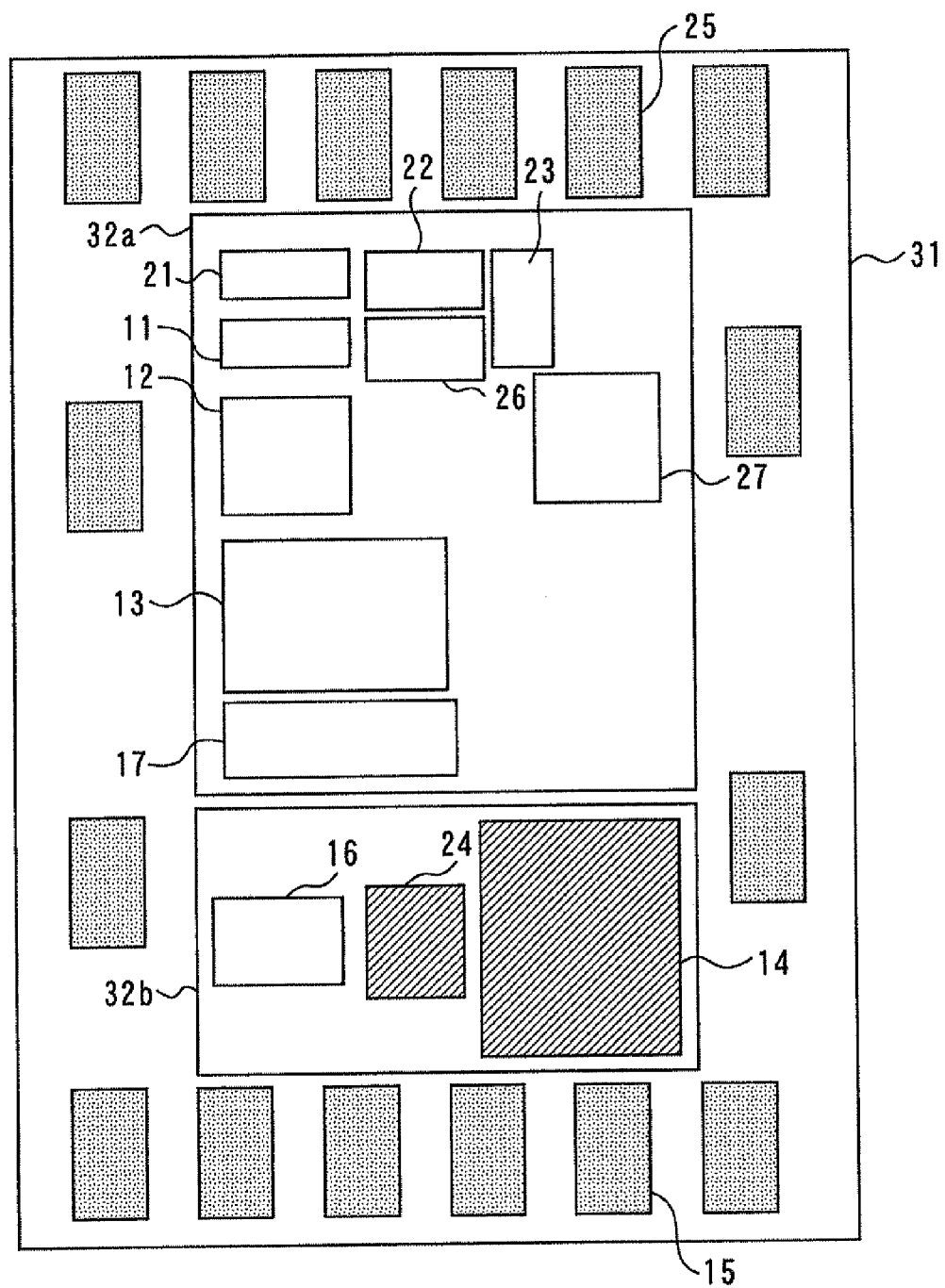
FIG. 18 is a diagram showing the chip layout of a power amplifier according to the eighth embodiment of the present invention.

FIG. 18 is a diagram showing the chip layout of a power amplifier according to the eighth embodiment of the present invention. A former amplification element 12 of the main power amplifier, a former amplification element 22 of the subsidiary power amplifier, a former bias circuit 26 of the subsidiary power amplifier, a latter bias circuit 17 of the main power amplifier, a latter bias circuit 27 of the subsidiary power amplifier, and the like are formed on a GaAs chip 32a (first chip).

On the other hand, a latter amplification element 14 of the main power amplifier and a latter amplification element 24 of the subsidiary power amplifier, and a former bias circuit 16 of the main power amplifier, are formed on another GaAs chip 32b (second chip). By thus collectively forming the latter amplification element 14 of the main power amplifier, the latter amplification element 24 of the subsidiary power amplifier preferably disposed closely to the latter amplification element 14 of the main power amplifier, and the former bias circuit 16 of the main power amplifier on a separate chip, the delay in the rise of the output power of the subsidiary power amplifier can be improved.

Ninth Embodiment

Figure 19:
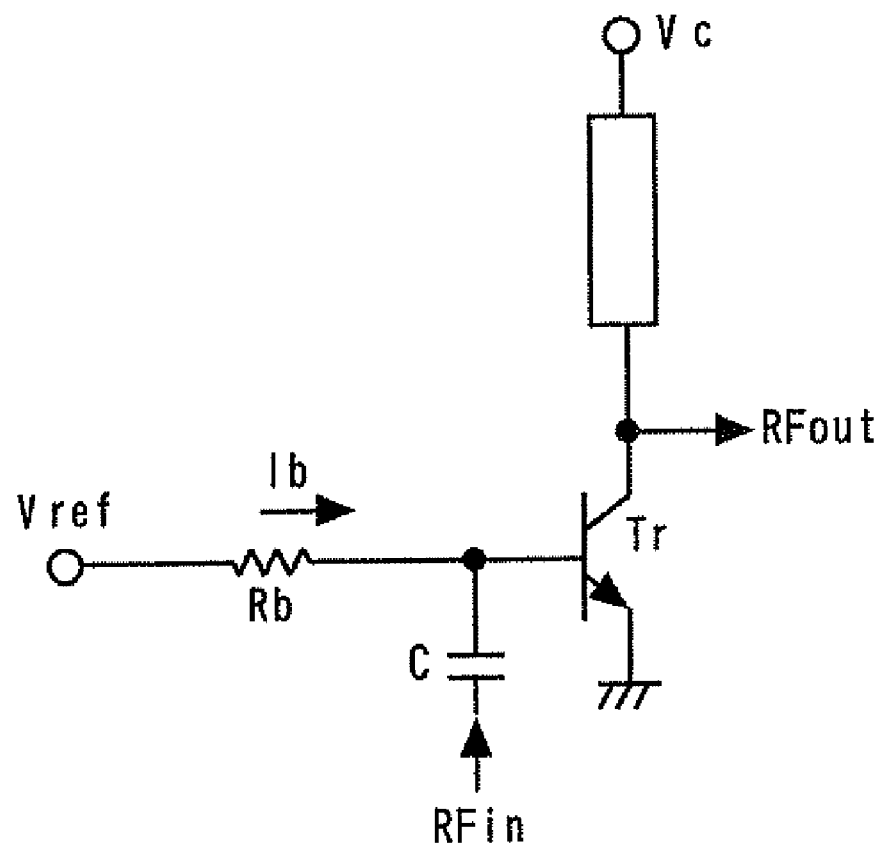
FIG. 19 is a circuit diagram showing a bias circuit according to the ninth embodiment of the present invention.

FIG. 19 is a circuit diagram showing a bias circuit according to the ninth embodiment of the present invention. This bias circuit is a former bias circuit or a latter bias circuit of the main power amplifier or the subsidiary power amplifier. The configurations other than the bias circuit are the same as the configurations of the first to eighth embodiments.

A resistor Rb is provided as a bias circuit. The resistor Rb inputs a current Ib corresponding to the control voltage inputted from the terminal Vref into the base (input terminal) of the corresponding amplification element Tr. The RF signals inputted from the terminal RFin are inputted into the base of the amplification element Tr via a capacitor C in the input matching circuit. The amplified RF signals are outputted from the collector of the amplification element Tr to the terminal RFout.

Figure 23:
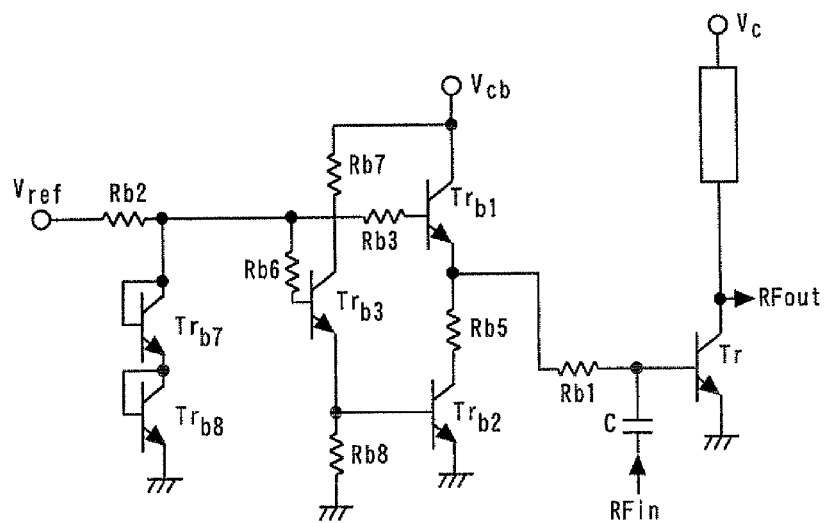
FIG. 23 is a circuit diagram showing a conventional bias circuit. This bias circuit is one of the above-described former bias circuit Bias 1 or latter bias circuit Bias 2.
Figure 24:
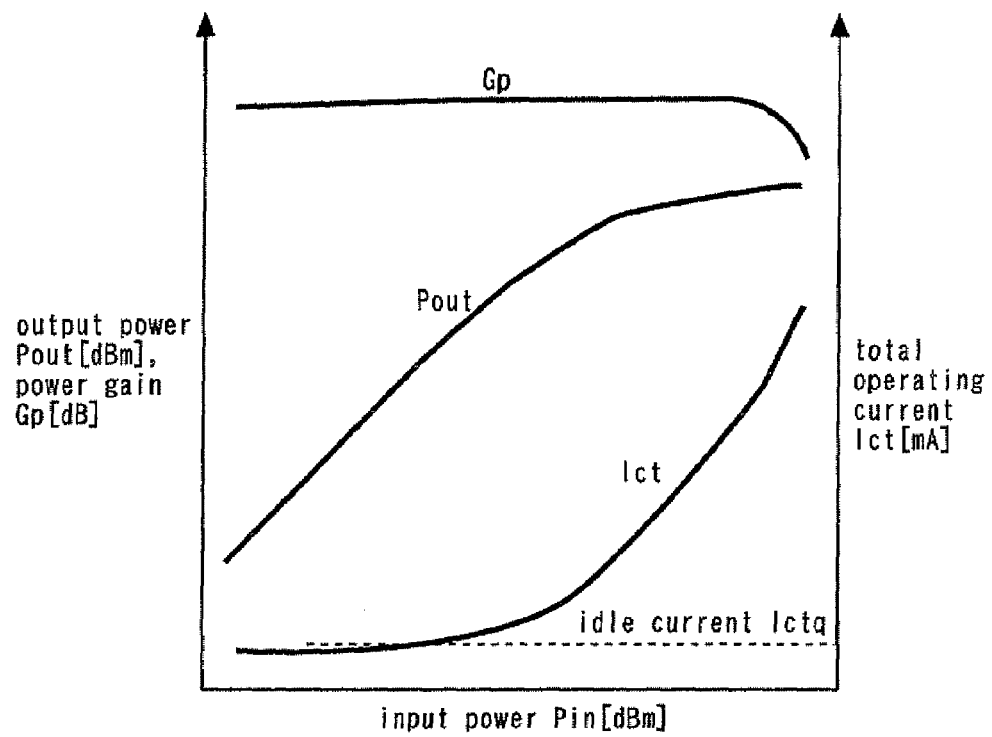
FIG. 24 is a graph showing the input-output characteristics of a conventional HBT power amplifier for CDMA.
Figure 25:
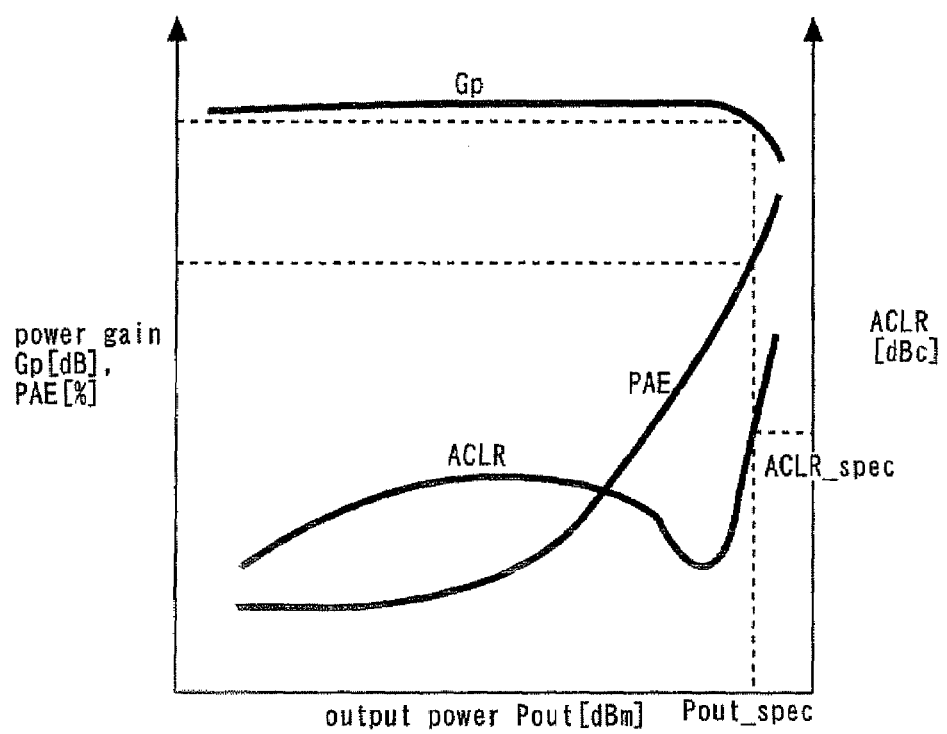
FIG. 25 is a graph showing the distortion characteristics of a conventional HBT power amplifier for CDMA.
Figure 26:
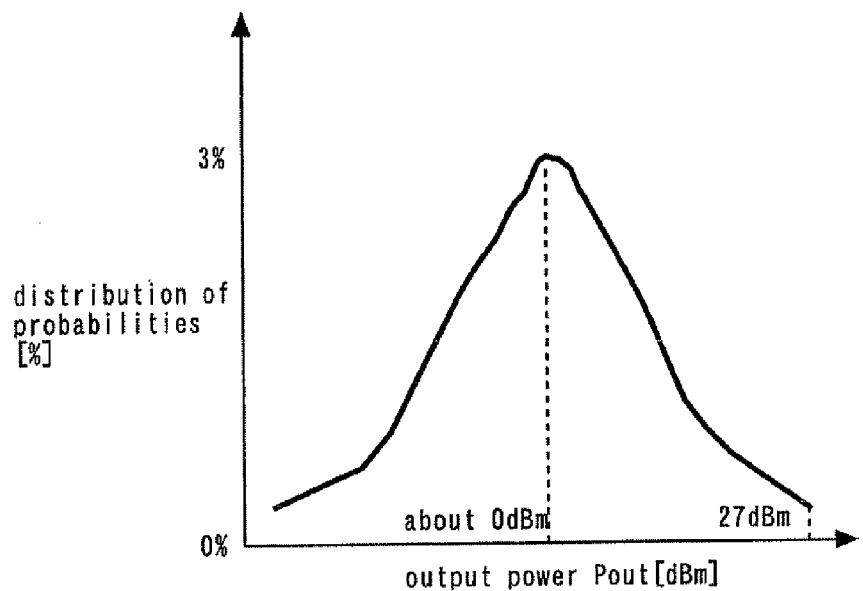
FIG. 26 is a graph showing the distribution of probabilities for the output power of a power amplifier in a CDMA terminal machine in a suburban area.
Figure 27:
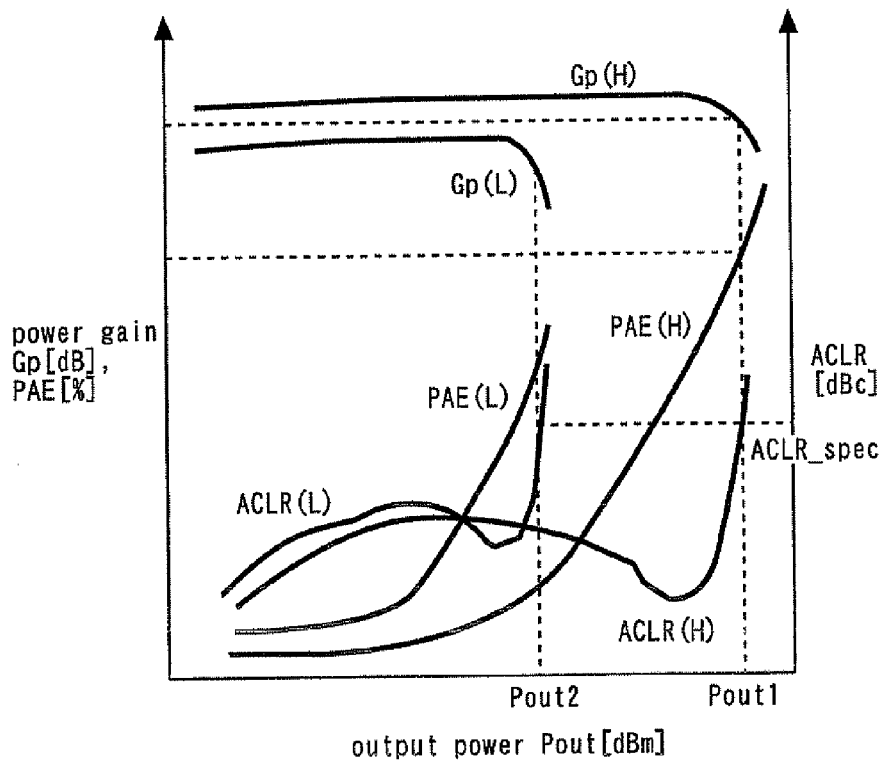
FIG. 27 is a graph showing the output and gain characteristics of the main power amplifier and the subsidiary power amplifier.
Figure 28:
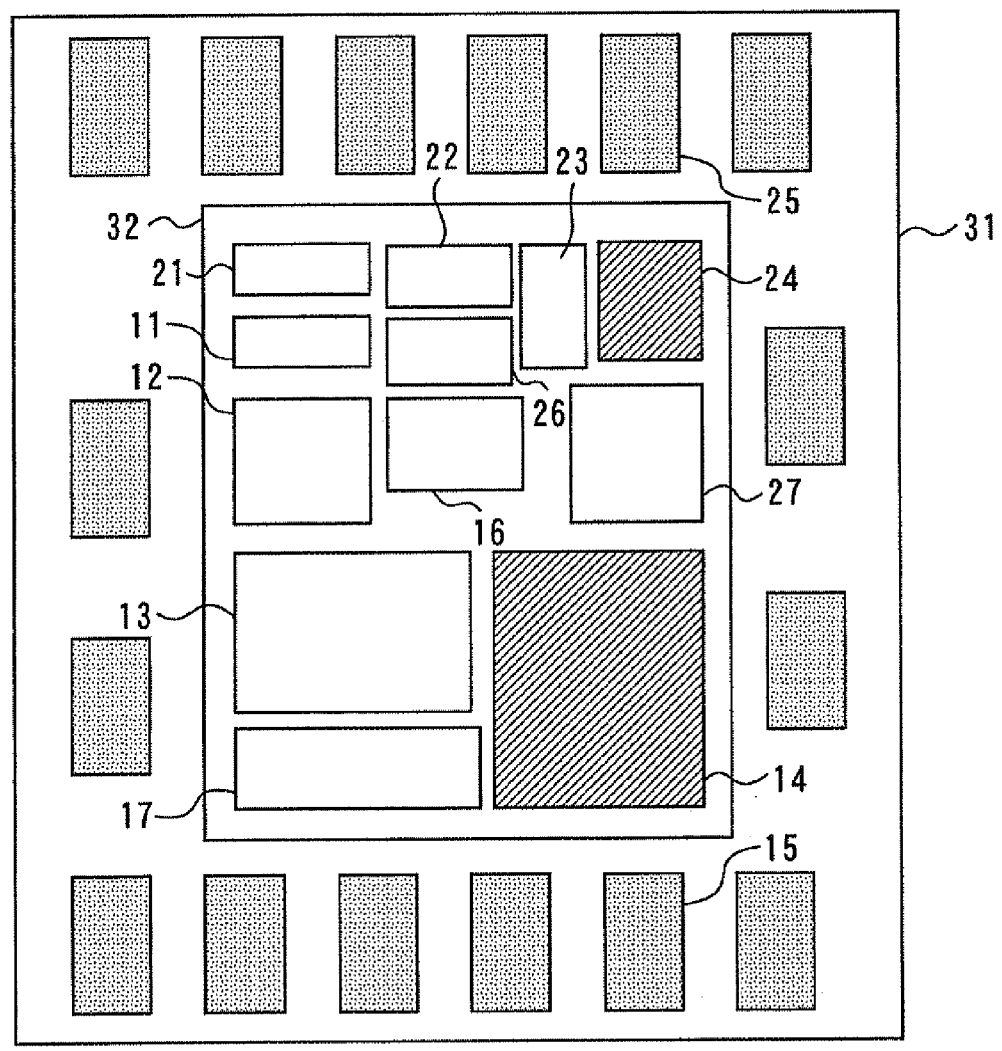
FIG. 28 is a diagram showing a chip layout of a conventional power amplifier operated by switching a main power amplifier and a subsidiary power amplifier.
Figure 29:
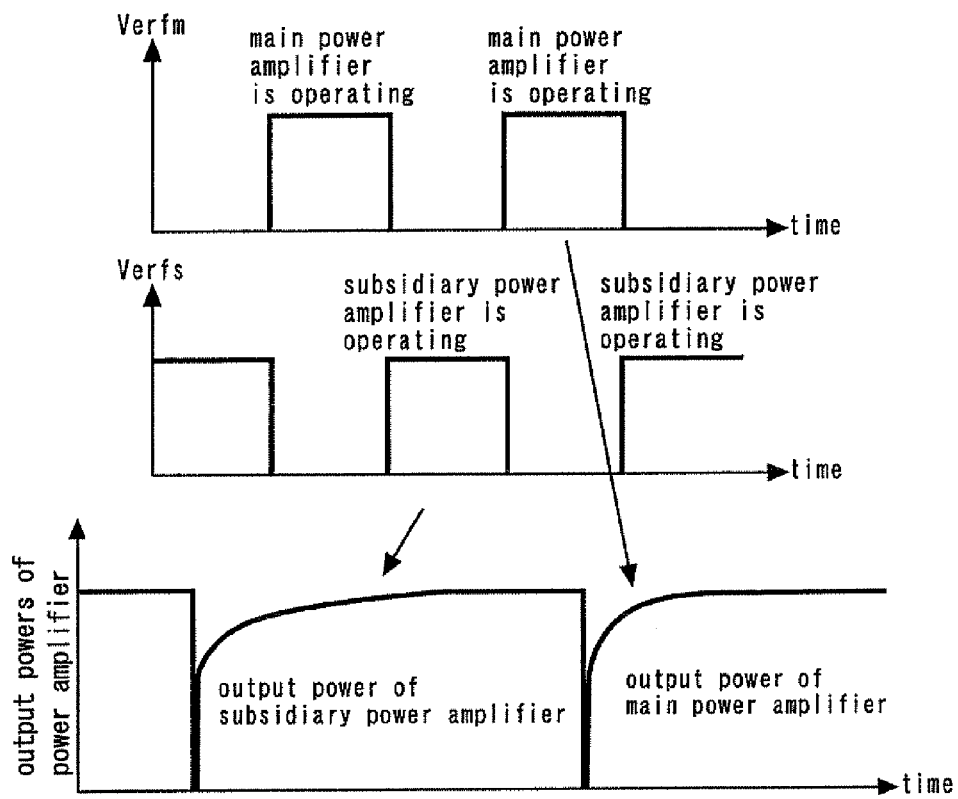
FIG. 29 is a graph showing output power characteristics of a conventional power amplifier operated by switching a main power amplifier and a subsidiary power amplifier.
Figure 30:
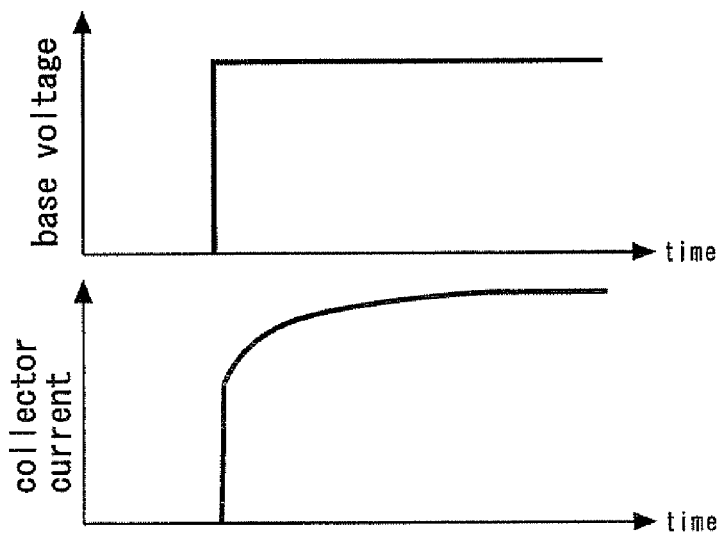
FIG. 30 is a graph showing the step response of the collector current of an HBT in base voltage driving.
Figure 31:
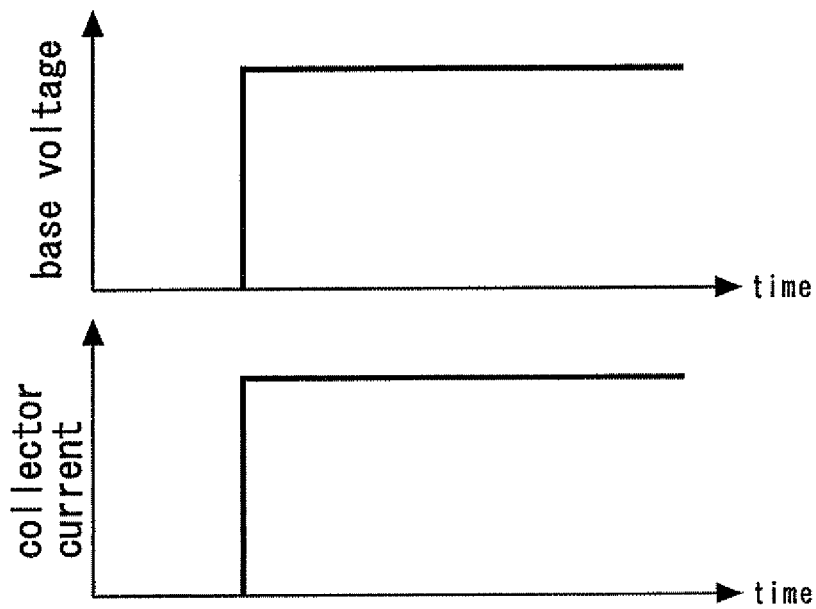
FIG. 31 is a graph showing the step response of the collector current of an HBT in base current driving.
Figure 32:
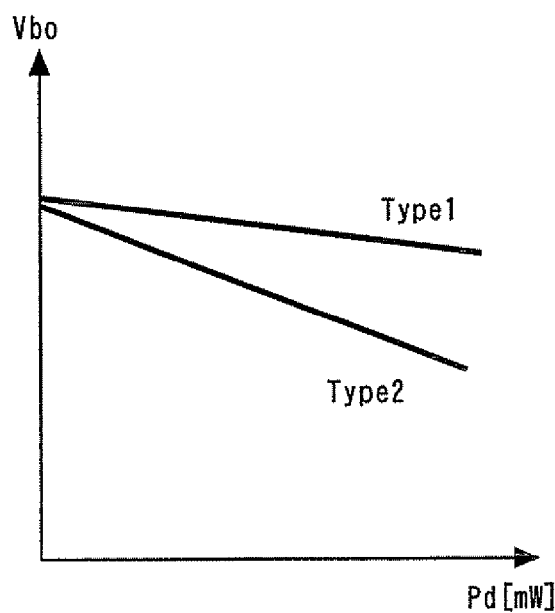
FIG. 32 is a graph showing the output voltage characteristics of the latter bias circuit of a subsidiary power amplifier against the heat generation of the latter bias circuit of a main power amplifier.

The bias circuit according to the present invention is a bias circuit driven by the base current. Thereby, the delay in the rise of the output power of the power amplifier can be improved by the amount of the delay otherwise caused by the collecting current compared with the case wherein an emitter follower circuit as shown in FIG. 23 is used as the bias circuit.

Tenth Embodiment

Figure 20:
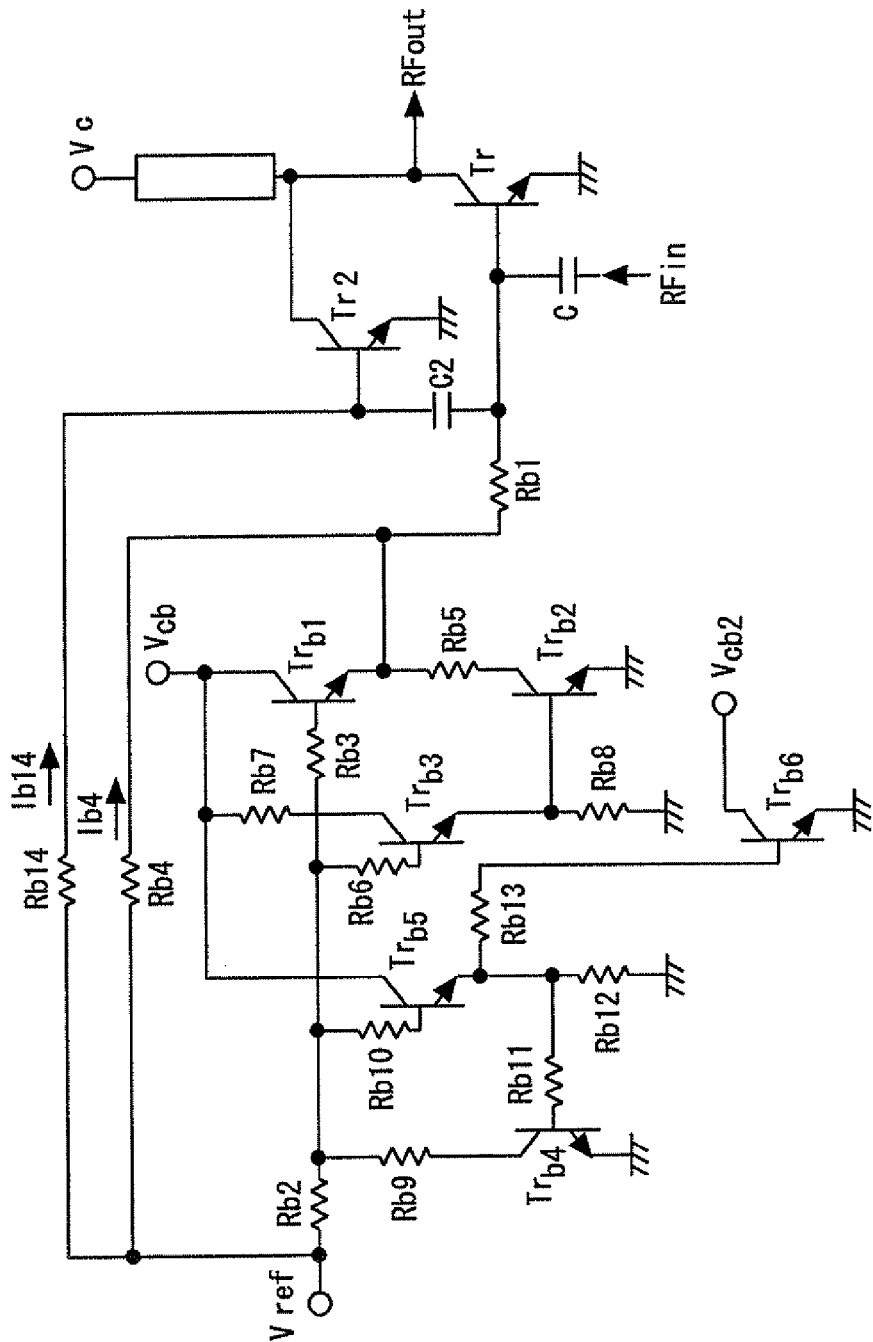
FIG. 20 is a circuit diagram showing a bias circuit according to the tenth embodiment of the present invention.

FIG. 20 is a circuit diagram showing a bias circuit according to the tenth embodiment of the present invention. This bias circuit is a former bias circuit or a latter bias circuit of the main power amplifier or the subsidiary power amplifier. The configurations other than the bias circuit are the same as the configurations of the first to eighth embodiments.

The symbol Vref denotes a terminal wherein a control voltage is applied from outside, $Tr_{b1}$ to $Tr_{b6}$ denote GaAs-HBTs, Tr and Tr2 denote amplification elements, and Rb1 to Rb14 denote resistors.

The emitter of $Tr_{b1}$ is connected to the base of Tr via Rb1. The base of $Tr_{b1}$ is connected to the terminal Vref via Rb2 and Rb3. The collector of $Tr_{b1}$ is connected to the power terminal $V_{cb}$. The emitter follower circuit containing $Tr_{b1}$ inputs voltage corresponding the control voltage into the base (input terminal) of the corresponding amplification element Tr.

A terminal of Rb4 is connected to Vref, and the other end is connected to the base of Tr via Rb1. Specifically, Rb4 is connected to $Tr_{b1}$ in parallel. Rb4 inputs current Ib4 corresponding the control voltage into the base (input terminal) of the corresponding amplification element Tr. Thereby, even in the idle state wherein the control voltage applied to the terminal Vref is lower than the operation voltage of $Tr_{b1}$, current can be supplied to the base of Tr.

The collector of $Tr_{b2}$ is connected to the emitter of $Tr_{b1}$ via Rb5. The emitter of $Tr_{b2}$ is connected to ground. The base of $Tr_{b3}$ is connected to the terminal Vref via Rb2 and Rb6. The collector of $Tr_{b3}$ is connected to the power terminal $V_{cb}$ via Rb7. The emitter of $Tr_{b3}$ is connected to the base of $Tr_{b2}$, and connected to ground via the resistor Rb8. $Tr_{b3}$ supplies bias current corresponding to the control voltage to the base of $Tr_{b2}$.

The collector of $Tr_{b4}$ is connected to the terminal Vref via Rb2 and Rb9. The emitter of $Tr_{b4}$ is connected to ground. The base of $Tr_{b5}$ is connected to the terminal Vref via Rb2 and Rb10. The collector of $Tr_{b5}$ is connected to the power terminal $V_{cb}$. The emitter of $Tr_{b5}$ is connected to the base of $Tr_{b4}$ via Rb11, and connected to ground via Rb12. Thereby, idle current at high temperatures can be suppressed, and the temperature dependence of idle current can be maintained substantially constant.

The base of $Tr_{b6}$ is connected to the emitter of $Tr_{b5}$ via Rb13. The collector of $Tr_{b6}$ is connected to the power terminal $V_{cb2}$, and the emitter is connected to ground. Thereby, since the operation of Tr can be emulated by $Tr_{b6}$, the variation of idle current can be further accurately suppressed.

The collector of Tr2 having a small emitter size is connected to the collector of Tr. The base of Tr2 is connected to the base of Tr via the capacitor C2. An end of Rb14 is connected to the terminal Vref, and the other end is connected to the base of Tr2. Rb14 inputs current Ib14 corresponding to the control voltage into the base of the corresponding amplification element Tr2. By thus providing the amplification element Tr2 that is operated only by current driving in parallel to the amplification element Tr, the variation of power gain against the input power can be suppressed.

The bias circuit according to the tenth embodiment can enable desired amplification maintaining substantially constant idle current from low temperatures to high temperatures even if the control voltage inputted from the terminal Vref is lowered to less than twice the barrier voltage of the amplification element. In the vicinity of the idle current, the amplification element is operated only by base current driving. Therefore, the delay in the rise of the output power of the power amplifier can be improved compared with the bias circuit driven by base voltage as shown in FIG. 23. However, in the bias circuit according to the tenth embodiment, base current driving is changed to the base voltage driving with the elevation of output power, and the delay in the rise of the output power remains slightly. Therefore, by combining the configuration of the tenth embodiment with the configurations in the first to eighth embodiments, the delay in the rise of the output power can be effectively improved.

Eleventh Embodiment

Figure 21:
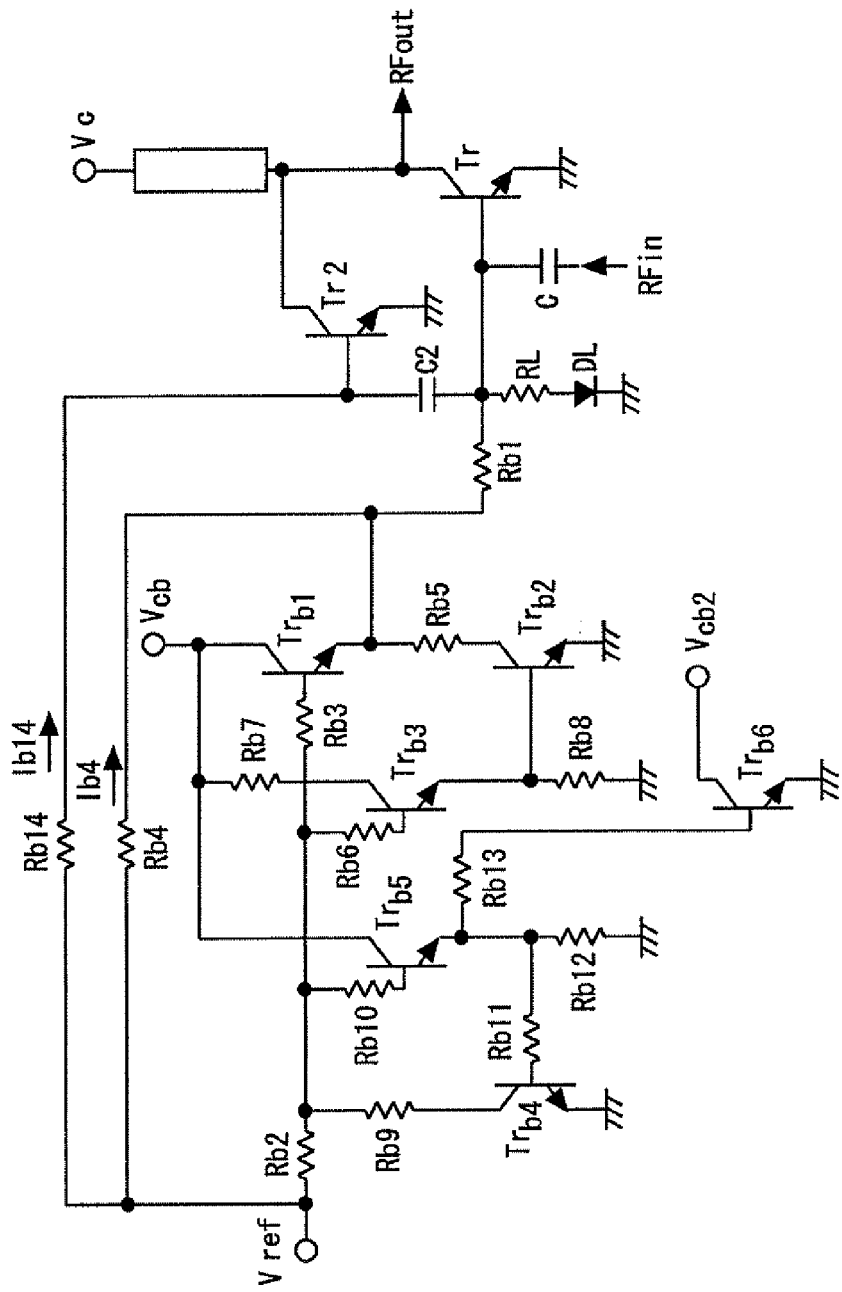
FIG. 21 is a circuit diagram showing a bias circuit according to the eleventh embodiment of the present invention.
Figure 22:
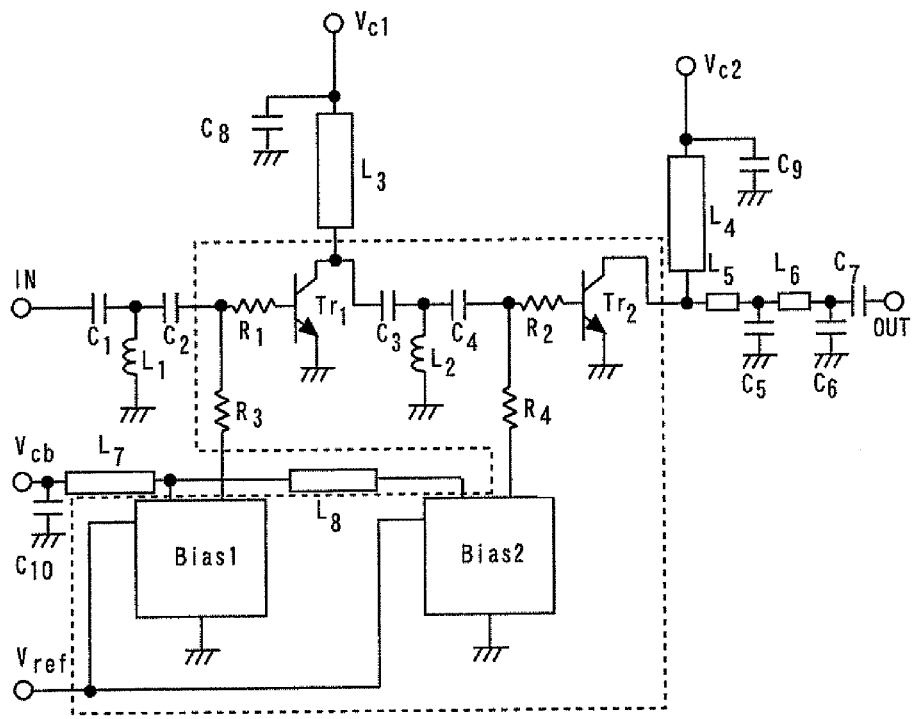
FIG. 22 is a circuit diagram showing a conventional GaAs-HBT power amplifier.

FIG. 21 is a circuit diagram showing a bias circuit according to the eleventh embodiment of the present invention. This bias circuit has a linearizer consisting of a diode DL and a resistor RL in addition to the tenth embodiment. Thereby, the distortion of signals inputted into the input terminal of the corresponding amplification element can be alleviated. However, if distortion characteristics have a room, the tenth embodiment having no linearizer is advantageous because the thermal response of the base voltage of the amplification element Tr is improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-191173, filed on Jul. 23, 2007 including specification, claims, drawings and summary, on which the Convention priority of the present application is based, are incorporated herein by reference in its entirety.

What is claimed is:

1. A power amplifier comprising a main power amplifier and a subsidiary power amplifier having an idle current smaller than idle current of the main power amplifier, and operated by switching the main power amplifier and the subsidiary power amplifier, wherein:
   each of the main power amplifier and the subsidiary power amplifier comprises a former amplification element for amplifying RF signals, a latter amplification element for amplifying output signals from the former amplification element, a former bias circuit for driving the former amplification element, and a latter bias circuit for driving the latter amplification element;
   spacing between the latter amplification element of the main power amplifier and the latter amplification element of the subsidiary power amplifier is not more than 100 µm; and
   spacing between the latter amplification element of the main power amplifier and the latter bias circuit of the subsidiary power amplifier is not less than 200 µm.

2. A power amplifier comprising a main power amplifier and a subsidiary power amplifier having an idle current smaller than idle current of the main power amplifier, and operated by switching the main power amplifier and the subsidiary power amplifier, wherein:
   each of the main power amplifier and the subsidiary power amplifier comprises a former amplification element for amplifying RF signals, a latter amplification element for amplifying output signals from the former amplification element, a former bias circuit for driving the former amplification element, and a latter bias circuit for driving the latter amplification element;
   spacing between the former amplification element of the main power amplifier and the former amplification element of the subsidiary power amplifier is not more than 50 µm; and spacing between the former amplification element of the main power amplifier and the former bias circuit of the subsidiary power amplifier is not less than 100 µm.

3. The power amplifier according to claim 1, wherein:
spacing between the former amplification element of the main power amplifier and the former amplification element of the subsidiary power amplifier is not more than 50 µm; and
spacing between the former amplification element of the main power amplifier and the former bias circuit of the subsidiary power amplifier is not less than 100 µm.

4. The power amplifier according to claim 3, wherein:
spacing between the latter amplification element of the main power amplifier and the former bias circuit of the main power amplifier is not more than 100 µm.

5. A power amplifier comprising a main power amplifier and a subsidiary power amplifier having an idle current smaller than idle current of the main power amplifier, and operated by switching the main power amplifier and the subsidiary amplifier, wherein:
each of the main power amplifier and the subsidiary power amplifier comprises a former amplification element for amplifying RF signals, a latter amplification element for amplifying output signals from the former amplification element, a former bias circuit for driving the former amplification element, and a latter bias circuit for driving the latter amplification element;
the latter amplification element of the main power amplifier comprises a first latter amplification element and a second latter amplification element;
spacing between each of the first and second latter amplification element and the latter amplification elements of the subsidiary power amplifier is not more than 100 µm; and
spacing between each of the first and second latter amplification elements and the latter bias circuit of the subsidiary power amplifier is not less than 200 µm.

6. The power amplifier according to claim 1, wherein the former bias circuit or the latter bias circuit comprises a resistor that receives a current corresponding to a control voltage applied to an input terminal of a corresponding amplification element.

7. The power amplifier according to claim 6, wherein the former bias circuit or the latter bias circuit further comprises an emitter follower circuit connected in parallel with the resistor, and receiving a voltage corresponding to the control voltage applied to the input terminal of a corresponding amplification element.

8. The power amplifier according to claim 7, wherein the former bias circuit or the latter bias circuit further comprises a linearizer for reducing distortion of signals input to the input terminal of a corresponding amplification element.

* * * * *